United States Patent
Moniwa et al.

(10) Patent No.: US 6,586,341 B2
(45) Date of Patent: Jul. 1, 2003

(54) METHOD OF MANUFACTURING SEMICONDUCTOR DEVICE

(75) Inventors: Akemi Moniwa, Sayama (JP); Hiroshi Fukuda, Kodaira (JP); Fumio Murai, Hinode (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/083,417

(22) Filed: Feb. 27, 2002

(65) Prior Publication Data

US 2002/0175298 A1 Nov. 28, 2002

(30) Foreign Application Priority Data

May 23, 2001 (JP) ........................................ 2001-153351

(51) Int. Cl.$^7$ .............................................. H01L 21/302
(52) U.S. Cl. ........................ 438/717; 438/945; 438/950; 430/312; 430/5
(58) Field of Search ................................. 438/717, 942, 438/945, 948, 949, 950; 430/396, 311, 312, 4, 5

(56) References Cited

U.S. PATENT DOCUMENTS

| | | | |
|---|---|---|---|
| 5,861,226 A | * | 1/1999 | Horne et al. ................ 438/717 |
| 5,863,712 A | * | 1/1999 | Von Bunau et al. ........ 430/396 |
| 6,394,797 B1 | * | 5/2002 | Sugaya et al. .............. 438/795 |

FOREIGN PATENT DOCUMENTS

JP 11-135417 * 5/1999

OTHER PUBLICATIONS

Pfeiffer, Hans, "Projection Exposure with Variable Axis Immersion Lenses: A High–Throughput Electron Beam Approach to "Suboptical" Lithography", Jpn. J. Appl. Phys., vol. 34, 1995, pp. 6658–6662.*
Liddle et al., "The SCattering with Angular Limitation in Projection Electron–Beam Lithography (SCALPEL) System", Jpn. J. Appl. Phys., vol. 34, 1995, pp. 6663–6671.*
Yamaguchi, Takeshi, "EB Stepper—A High Throughput Electron–Beam Projection Lithography System", Jpn. J. Appl. Phys., vol. 39, pp. 6897–6901.*
48th Japan Society of Applied Physics Academic Lecture Preliminary Report, 2001.*

* cited by examiner

Primary Examiner—Kevin M. Picardat
(74) Attorney, Agent, or Firm—Antonelli, Terry, Stout & Kraus, LLP

(57) ABSTRACT

To provide a method of manufacturing a semiconductor device for manufacturing a minute pattern with high accuracy using a stencil mask. An input layout data is classified into rectangles according to pattern width or the like, a boundary is created that divides a periphery or an inside of each classified graphics, an input pattern is fractionized by the boundary, and a complementary mask with fractionized patterns on both sides of the boundary distributed into different layers is used to form a pattern.

24 Claims, 19 Drawing Sheets

(A) BOUNDARY BY MESH PARALLEL TO X AXIS (B) BOUNDARY BY MESH PARALLEL TO Y AXIS (C) BOUNDARY BY MESH PARALLEL TO X AND Y AXES (D) BOUNDARY DIVIDING LONG SIDE DIRECTION

FIG. 5

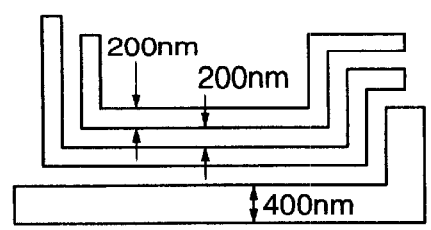

(A) INPUT PATTERN

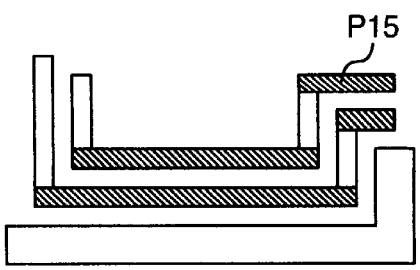

(B) 200nm WIDE RECTANGLE WITH LONG SIDE IN X AXIS DIRECTION

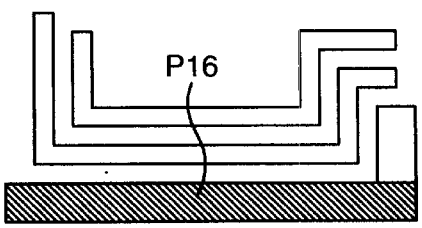

(C) 400nm WIDE RECTANGLE WITH LONG SIDE IN X AXIS DIRECTION

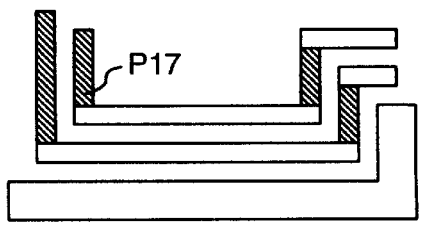

(D) 200nm WIDE RECTANGLE OTHER THAN B AND C

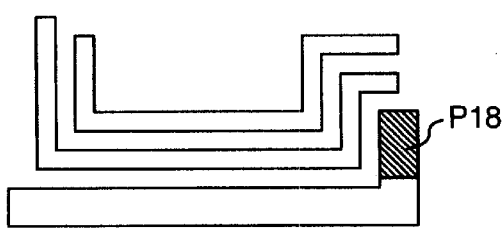

(E) 400nm WIDE RECTANGLE OTHER THAN B AND C

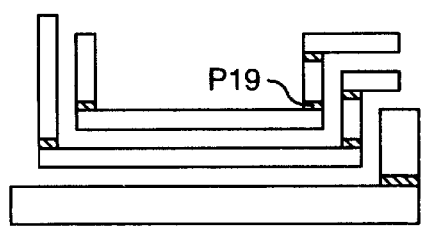

(F) BOUNDARY GRAPHICS FORMED BY ENLARGED GRAPHICS OF B AND C

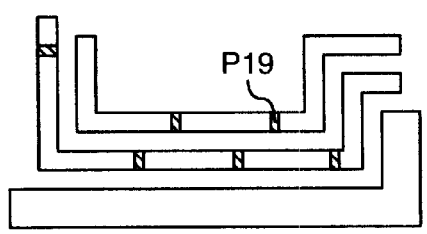

(G) BOUNDARY GRAPHICS FORMED IN B AND C

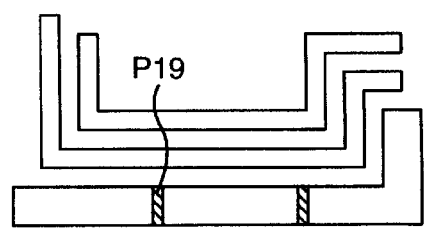

(H) BOUNDARY GRAPHICS FORMED IN D AND E

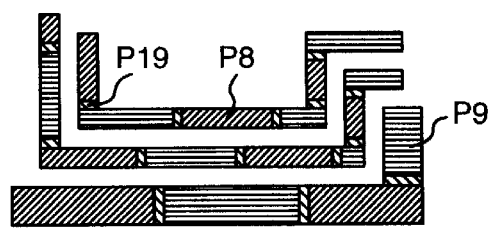

(I) DISTRIBUTE BOTH SIDES OF BOUNDARY GRAPHICS INTO TWO LAYERS

FIG. 6
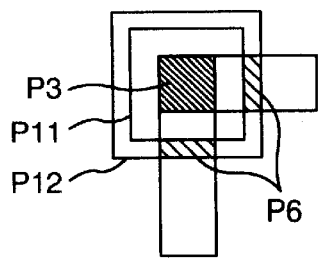
FIG. 7
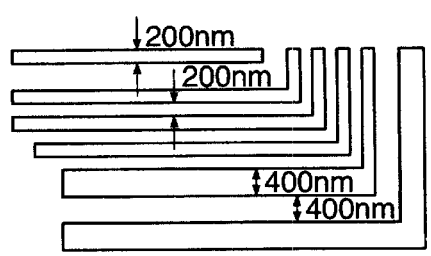
(A) INPUT PATTERN
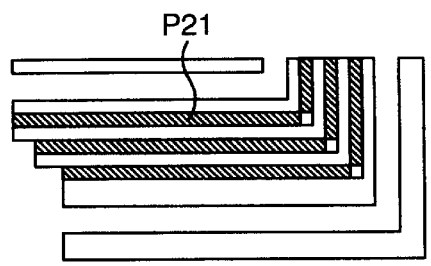
(B) EXTRACT PART WITH 200nm SPACE BETWEEN PATTERNS
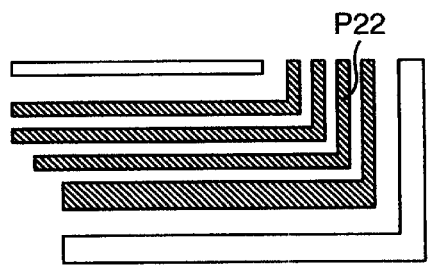
(C) EXTRACT PATTERN ADJACENT TO B
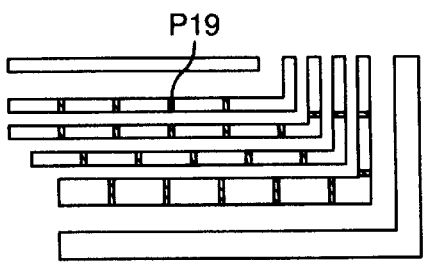
(D) GENERATE BOUNDARY GRAPHICS AT 1200nm INTERVALS IN PATTERN OF C
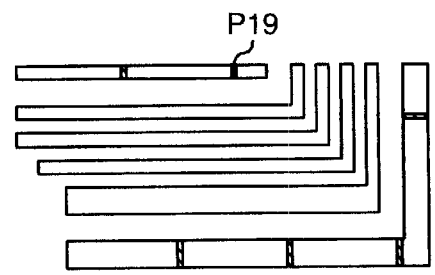
(E) GENERATE BOUNDARY GRAPHICS AT 2200nm INTERVALS IN PATTERN OTHER THAN C
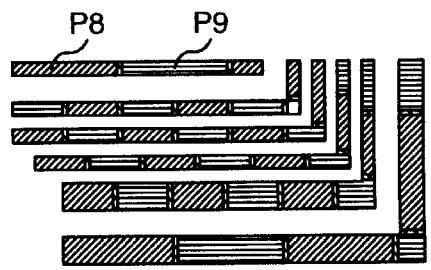
(F) DISTRIBUTE INTO COMPLEMENTARY LAYER

FIG. 8
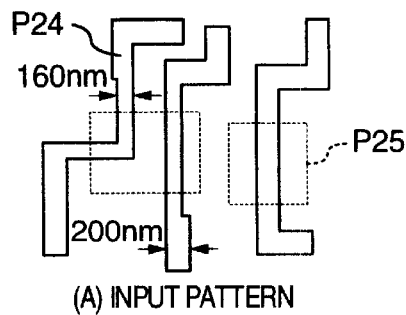
(A) INPUT PATTERN
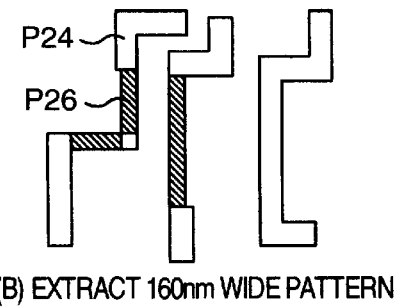
(B) EXTRACT 160nm WIDE PATTERN
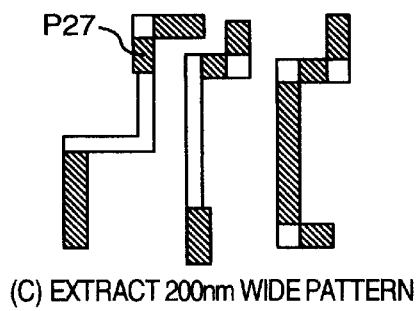
(C) EXTRACT 200nm WIDE PATTERN
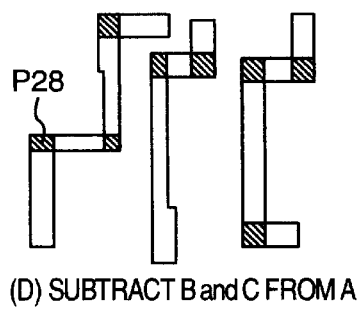
(D) SUBTRACT B and C FROM A
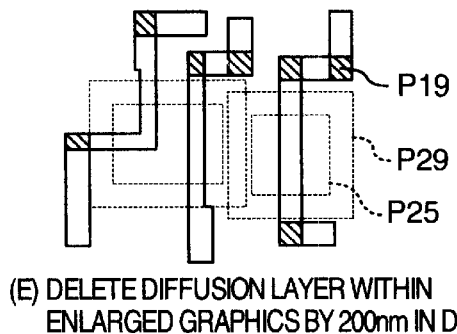
(E) DELETE DIFFUSION LAYER WITHIN ENLARGED GRAPHICS BY 200nm IN D
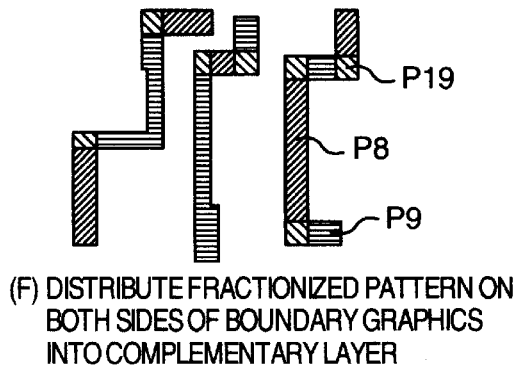
(F) DISTRIBUTE FRACTIONIZED PATTERN ON BOTH SIDES OF BOUNDARY GRAPHICS INTO COMPLEMENTARY LAYER
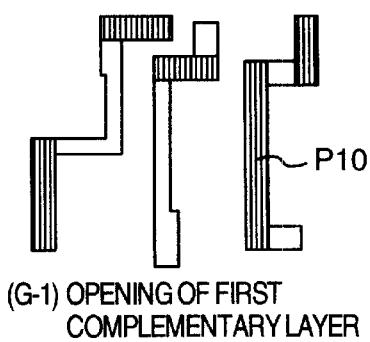
(G-1) OPENING OF FIRST COMPLEMENTARY LAYER
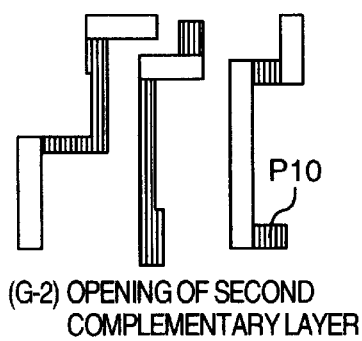
(G-2) OPENING OF SECOND COMPLEMENTARY LAYER

FIG. 12
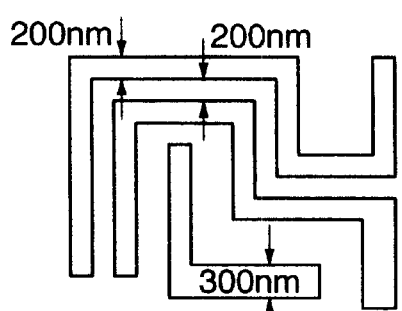
(A) INPUT PATTERN
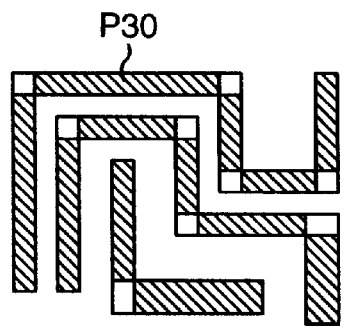
(B) EXTRACT RECTANGULAR PATTERN
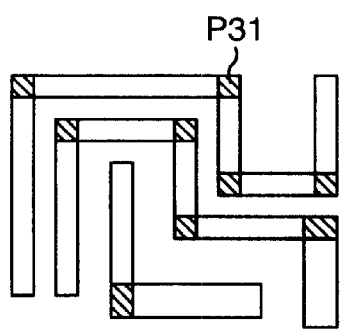
(C) CORNER GRAPHICS
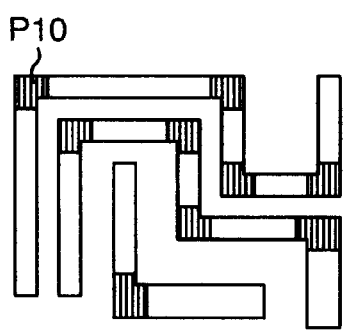
(D-1) OPENING OF FIRST COMPLEMENTARY LAYER
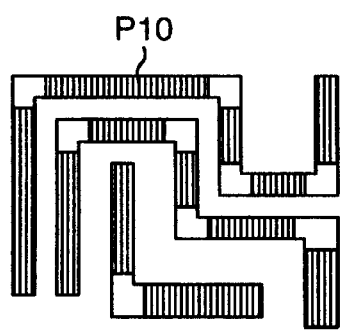
(D-2) OPENING OF SECOND COMPLEMENTARY LAYER

FIG. 14
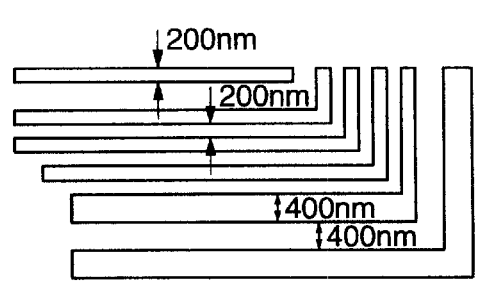
(A) INPUT PATTERN
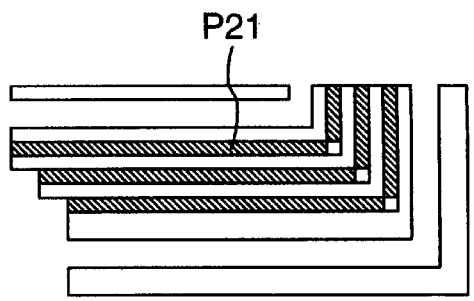
(B) EXTRACT PART WITH 200nm OR SMALLER SPACE BETWEEN PATTERNS
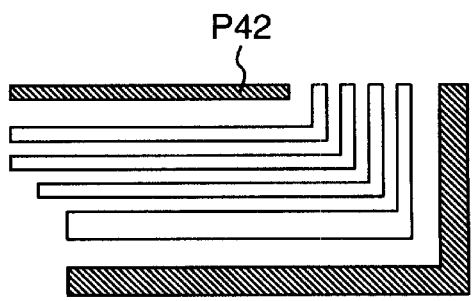
(C) EXTRACT PATTERN NOT ADJACENT TO B
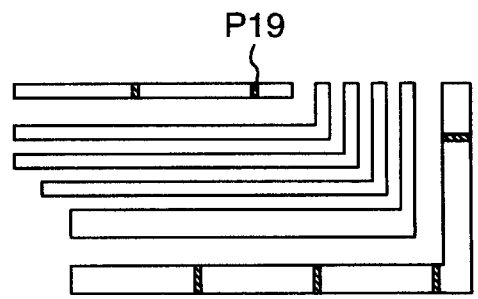
(D) GENERATE BOUNDARY GRAPHICS AT 2200nm INTERVALS IN PATTERN OF C
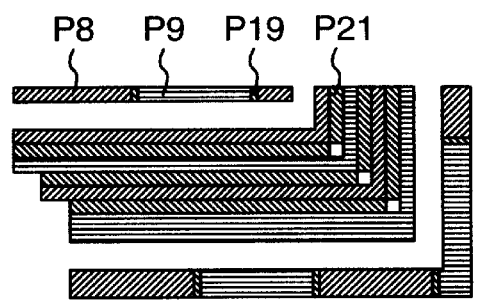
(E) DISTRIBUTE INTO COMPLEMENTARY LAYER

FIG. 15
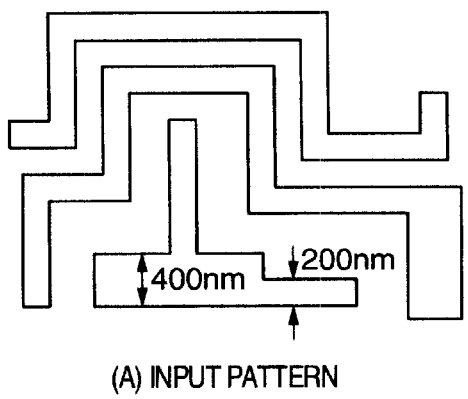
(A) INPUT PATTERN
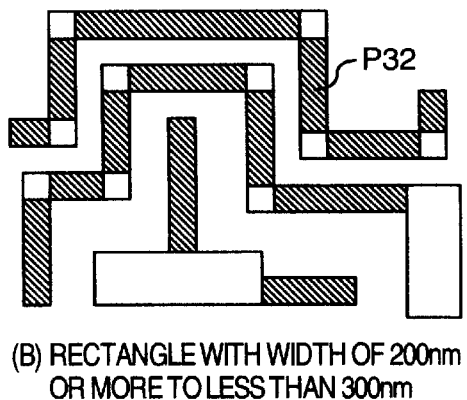
(B) RECTANGLE WITH WIDTH OF 200nm OR MORE TO LESS THAN 300nm
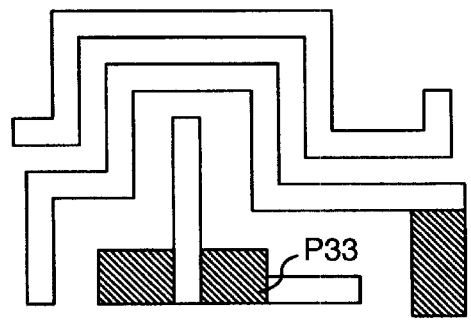
(C) RECTANGLE WITH WIDTH OF 300nm OR MORE TO LESS THAN 500nm
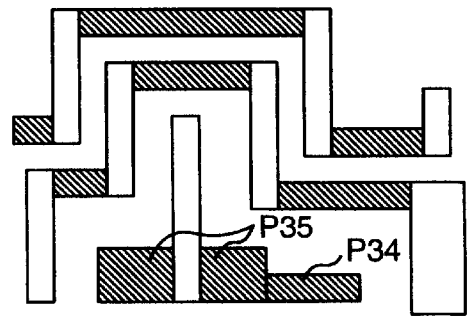
(D) RECTANGLE WITH LONG SIDE IN X AXIS DIRECTION AMONG RECTANGLES OF B AND C
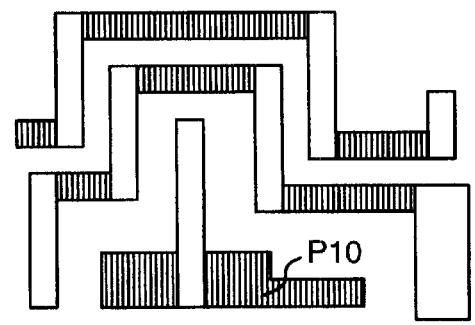
(E-1) OPENING OF FIRST COMPLEMENTARY LAYER
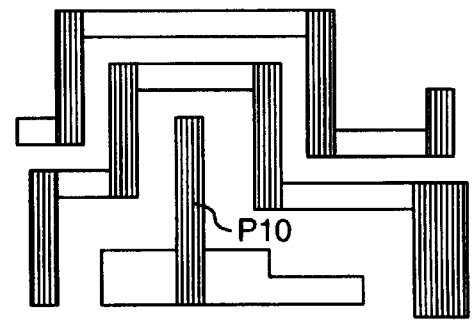
(E-2) OPENING OF SECOND COMPLEMENTARY LAYER FIG. 16
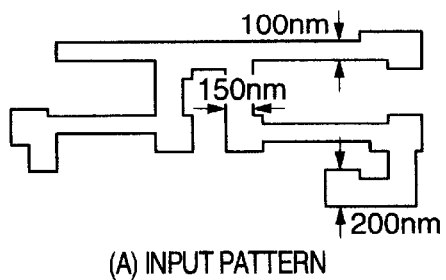
(A) INPUT PATTERN
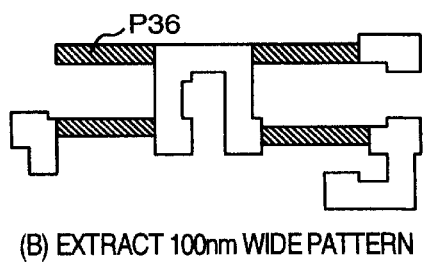
(B) EXTRACT 100nm WIDE PATTERN
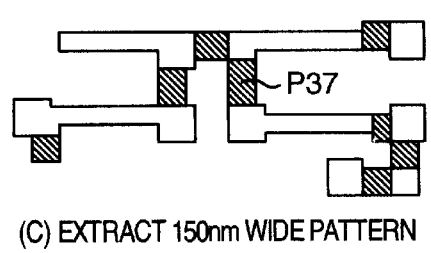
(C) EXTRACT 150nm WIDE PATTERN
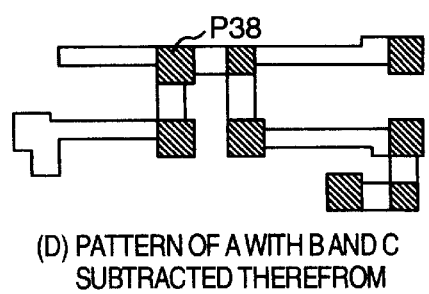
(D) PATTERN OF A WITH B AND C SUBTRACTED THEREFROM
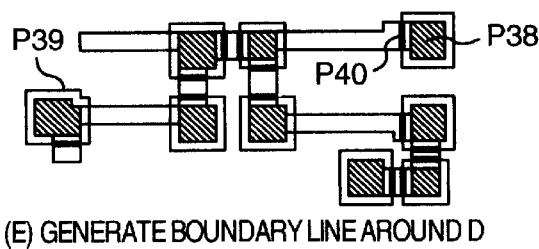
(E) GENERATE BOUNDARY LINE AROUND D
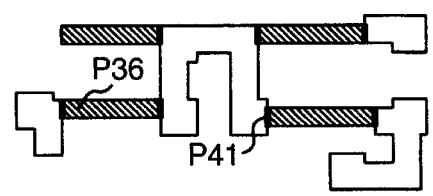
(F) GENERATE BOUNDARY LINE AT CONNECTING PORTION OF B
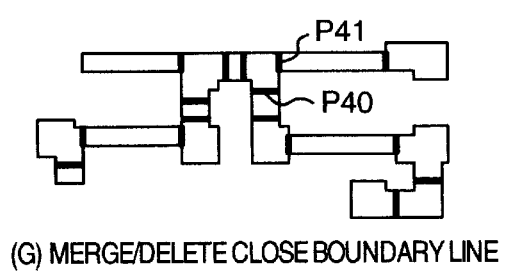
(G) MERGE/DELETE CLOSE BOUNDARY LINE
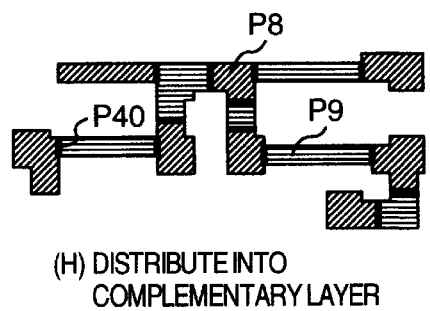
(H) DISTRIBUTE INTO COMPLEMENTARY LAYER
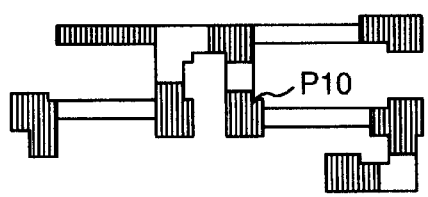
(I-1) OPENING OF FIRST COMPLEMENTARY LAYER
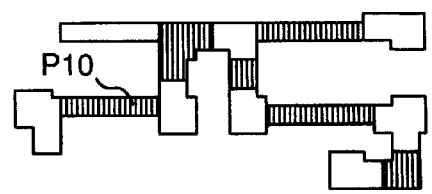
(I-2) OPENING OF SECOND COMPLEMENTARY LAYER (A) INPUT PATTERN            (B) DIVIDED PATTERN

FIG. 20
 
(A) INPUT PATTERN
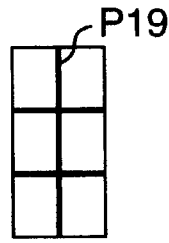 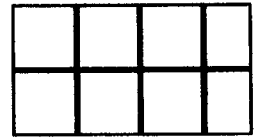
(B) GENERATE BOUNDARY LINE
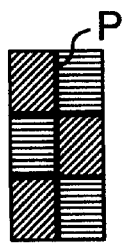 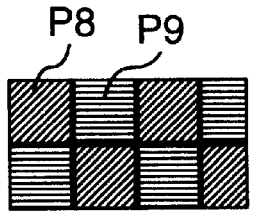
(C) DISTRIBUTE INTO COMPLEMENTARY LAYER
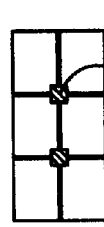 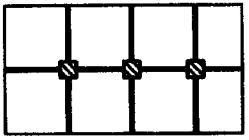
(D) GENERATE PATTERN WITH MINIMUM DIMENSION IN MASK RULE AT INTERSECTION POINT OF BOUNDARY LINES
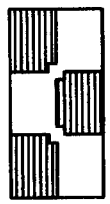 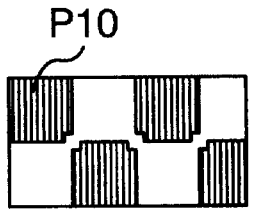
(E-1) OPENING OF FIRST COMPLEMENTARY LAYER
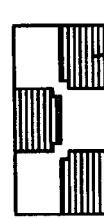 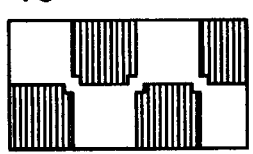
(E-2) OPENING OF SECOND COMPLEMENTARY LAYER

FIG. 22

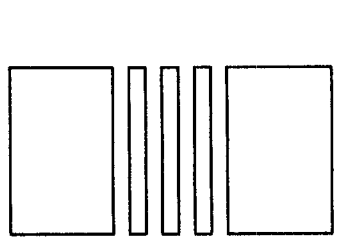

(A) INPUT PATTERN

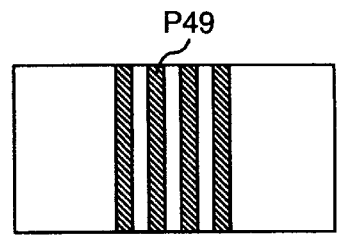

(B) AREA SMALLER THAN DESIGNATED INTERVAL

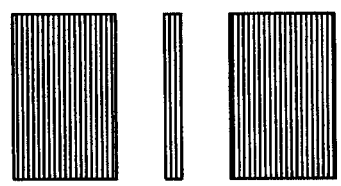

(C-1) OPENING OF FIRST COMPLEMENTARY LAYER

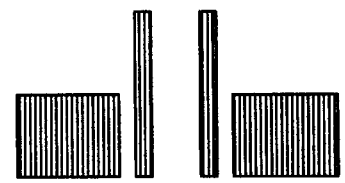

(D-1) OPENING OF FIRST COMPLEMENTARY LAYER

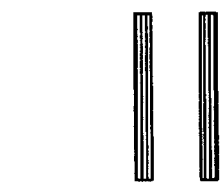

(C-2) OPENING OF SECOND COMPLEMENTARY LAYER

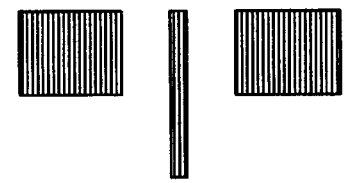

(D-2) OPENING OF SECOND COMPLEMENTARY LAYER (C) WHEN EVERY OTHER PATTERN ADJACENT TO AREA SMALLER THAN DESIGNATED PATTERN INTERVAL IS DISTRIBUTED INTO COMPLEMENTARY LAYER (D) WHEN EVERY OTHER PATTERN BETWEEN AREAS SMALLER THAN DESIGNATED PATTERN INTERVAL IS DISTRIBUTED INTO COMPLEMENTARY LAYER

METHOD OF MANUFACTURING SEMICONDUCTOR DEVICE

BACKGROUND OF THE INVENTION

1. Field of the Invention

The present invention relates to mask pattern transfer lithography technique in manufacturing a semiconductor integrated circuit or a crystal panel, and more particularly to a method of manufacturing a semiconductor device using a stencil mask having an opening (through hole) pattern.

2. Prior Art

In lithography technique used for forming patterns of semiconductor integrated circuits or the like, electron beam projection and exposure has been studied in which a mask is irradiated with a uniform electron beam and the electron beam passing through the mask is projected on a wafer by an electron optical system. Electron beam projection and exposure technique is described in Japanese Journal of Applied Physics vol. 34 (1995), pp. 6658–6662, Japanese Journal of Applied Physics vol. 34 (1995), pp. 6663–6671, and Japanese Journal of Applied Physics vol. 39 (2000), pp. 6897–6901.

The mask used in this electron beam projection and exposure technique includes a transmission area that transmits the electron beam and has an electron beam image of a desired pattern shape reach on a wafer, and a scattering area that disperses the electron beam and prevents the electron beam from reaching on the wafer.

Mask structures invented are a membrane type mask having a thin film remain on the electron beam transmission area, and a stencil type mask having no thin film remain to form an opening. The membrane mask has at least the thin film throughout the mask, so that existence of an electron beam dispersion area (doughnut pattern) completely surrounded by the electron beam transmission area causes no problem. However, the electron beam transmission area has the thin film, and thus energy loss of the transmission electron beam causes chromatic aberration to thereby cause a problem of degradation of a transfer pattern shape. In the stencil mask, an electron beam transmitting portion is an opening to thereby prevent the degradation of the transfer pattern due to the chromatic aberration. However, when the doughnut pattern exists, the stencil mask cannot support electron beam dispersion area surrounded by an electron beam transmission, and thus technique has been proposed in which the doughnut pattern is divided into two parts and a mask is divided into two masks (complementary masks) having the respective parts for transfer.

The complementary mask has an object to solve the problem of the doughnut pattern, and also has an advantage of preventing degradation in pattern accuracy due to Coulomb effect by a uniform mask opening ratio for each predetermined area.

For the complementary mask division, JP-A-11-135417 specification discloses that a bending portion is a dividing boundary.

48th Japan Society of Applied Physics Academic Lecture Preliminary Report (March 2001, Meiji University), No. 2, p. 747 discloses that a doughnut pattern, leaf like pattern and L shaped pattern are extracted/divided, and the other patterns are also divided so as to have substantially equal area ratios after the complementary mask division.

JP-A-11-135417 specification does not disclose in detail methods of corner extraction from layout data and generation of two mask data. When an elongate dispersion area is between the openings, it is preferable that the dispersion area is divided into parts to use complementary masks having the respective parts in order to prevent mask deformation, but the document does not consider flexion of the mask at an opening of a long side.

In the technique described in 48th Japan Society of Applied Physics Academic Lecture Preliminary Report (March 2001, Meiji University), No. 2, p. 747, a dividing boundary of a pattern is only a line parallel to the y axis as is apparent from a drawing in the document, and a narrow slit like pattern is generated in a step like pattern portion where the y coordinate gradually changes as shown in FIG. 17. This is a significant factor of degradation in EB drawing accuracy in mask fabrication like a problem of a minute pattern in EB data generation. The above described document has no description on alignment error.

Although it is described that the patterns are divided so as to have substantially equal area ratios, there is no description on a range of the equal area ratios. The complementary masks have the equal area ratios because the Coulomb effect that may cause degradation of a focusing pattern has equal influences on two complementary masks.

However, in the known examples, when an area ratio of an upper half of a subfield (an area that can be irradiated with an electron beam at once) of one mask after division is 50% and an area ratio of a lower half is 5%, an area ratio of the entire subfield is 30% and less, but there is a problem that resolution is locally degraded in the upper half due to the Coulomb effect. From the inventors' studies, this may be because an influence range of the Coulomb effect (hereinafter referred to as Coulomb effect influence range) is smaller than the subfield. The Coulomb effect influence range depends on an optical system, and may be, for example, about $1/10$ or less of one side of the subfield.

SUMMARY OF THE INVENTION

An object of the present invention is to provide a method of manufacturing a semiconductor device capable of forming a fine pattern with high accuracy using a complementary mask.

Outlines of representative aspects of the invention disclosed in this application are as follows:

Input layout data is classified into a rectangle having a width within a certain range, a boundary is created in accordance with a reference point provided for each classified rectangles, the input layout data is divided into fractionized patterns using the boundary, and the fractionized patterns adjacent to each other via the boundary are distributed into two masks so as to be in different masks. The boundary may be created in any of an x axis direction or a y axis direction. The boundary may be a boundary line or a boundary figure having an area.

A doughnut pattern can be surely divided into a set of rectangles and thus can be divided into two masks. Appropriately setting a dividing length of a rectangle can prevent generation of an elongate dispersion portion between openings.

When the boundary is a figure with an area, the boundary figure is included in both of the complementary masks to prevent breaking of a wire when alignment error occurs. If the distributed fractionized patterns and boundary figures are output in different layers, it is easy to increase overlap between the complementary masks for preventing the alignment error by enlarging the boundary figure and operating OR with the complementary layers. Thus data can be generated with a large alignment margin without generating again the complementary mask data from the beginning.

In the layout data for the complementary mask generated by the layout data dividing method for the complementary mask as described above, a pattern area ratio within a range influenced by the Coulomb effect around any chosen position of each complementary layer is less than a predetermined value. Specifically, the area ratio within the range influenced by the Coulomb effect is preferably 30% and less. The Coulomb effect influence range depends on an electron optical system, but may be typically 10 to 50 µm. Pattern degradation due to the Coulomb effect may be prevented if the area ratio within the Coulomb effect influence range is 20% to 40%. This is not the case when no fine pattern influenced by the Coulomb effect exists. Specifically, a dimension dividing reference unit when the input data in the form of fractionized patterns is distributed into the complementary layers are set sufficiently smaller than a property length influenced by the Coulomb effect depending on the pattern shapes, and thus the area ratio within the Coulomb effect influence range around any chosen point of the complementary layer can be divided into equal parts for each complementary layer or can be less than a predetermined value in each complementary layer. Therefore, influence on resolution of the Coulomb effect is smaller than a certain value in any areas where the Coulomb effect locally occurs on the mask, thus obtaining a desired resolution.

When a gate of an MOS transistor is formed by optical lithography, in order to generate a phase shift mask pattern for exposing both sides of the gate to light of substantially opposite phases, a pattern operation tool is used that has a function of outputting patterns on both sides of a gate pattern as in different layers, and with the pattern to be divided by the boundary (the sum of the area of the fractionized patterns on both sides of the boundary and the boundary) and the boundary over the pattern, the fractionized patterns on both sides of the boundary are determined as a first complementary layer and a second complementary layer, respectively.

There can be provided a method of manufacturing a semiconductor device capable of forming a fine pattern with high accuracy using a complementary mask having no elongate electron-scattering portion between the openings that may cause flexion of the mask and a complementary mask in which no pattern degradation occurs due to the alignment error resulting from double exposure. Using the complementary mask can eliminate the doughnut pattern, and a uniform mask opening ratio for each predetermined area can further increase dimensional accuracy.

In the Coulomb effect influence range, dividing the pattern into the complementary mask in such a manner that a maximum area ratio of the mask is within a certain limit is advantageous for pattern dimensional accuracy.

Further, the complementary mask data can be automatically obtained at high speed using an existing pattern operation tool with respect to any chosen layout pattern data. That is, there may be no need for developing a new special program requiring development hours in order to generate such complementary mask data.

Other objects, features, and advantages of the invention will be apparent from the following description of embodiments of the invention with reference to the accompanying drawings.

BRIEF DESCRIPTION OF THE DRAWINGS

FIG. 5 is a plan view of a pattern and shows a flow of processing in Embodiment 2;

FIG. 6 is a plan view of an example of creating a corner boundary;

FIG. 7 is a plan view of a pattern and shows a flow or processing in Embodiment 3;

FIG. 8 is a plan view of a pattern and shows a flow of processing in Embodiment 5;

FIG. 12 is a plan view of a pattern and shows a flow of processing in Embodiment 7;

FIG. 14 is a plan view of a pattern and shows a flow of processing in Embodiment 4;

FIG. 15 is a plan view of a pattern and shows a flow of processing in Embodiment 8;

FIG. 16 is a plan view of a pattern and shows a flow of processing in Embodiment 9;

FIG. 20 is a plan view of a pattern and shows a flow of processing in Embodiment 15;

FIG. 22 is a plan view of a pattern and illustrates a difference between when every other pattern adjacent to an area smaller than a designated pattern interval is distributed into a complementary layer and when every other pattern between areas smaller than a designated pattern interval is distributed into a complementary layer;

DESCRIPTION OF THE PREFERRED EMBODIMENTS

Now, embodiments of the invention will be described in detail.

(Embodiment 1)

Figure 1:
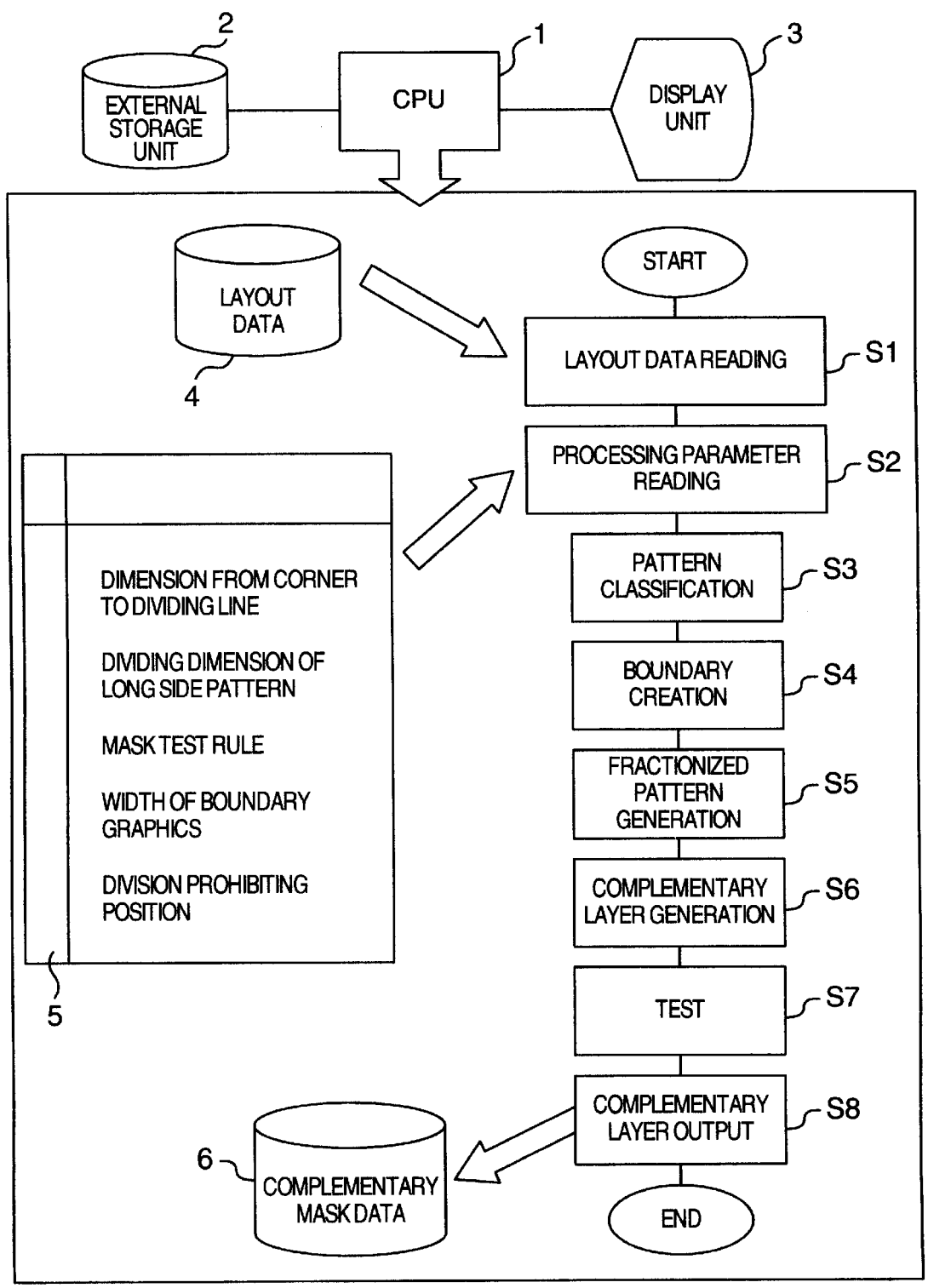
FIG. 1 is a processing flow according to the present invention.

With reference to a data processing flow in FIG. 1, processing of layout data in FIG. 2 will be described. All the dimensions mentioned below are values in wafer scale. In reduction projection, values in mask scale are obtained by multiplying the values in wafer scale by a reciprocal of a reduction ratio (typically about 4 to 6).

Hardware includes a CPU 1, an external storage unit 2, and a display unit 3.

First, a layout data 4 is read in layout data reading S1. The layout data read is a pattern having a minimum line width of 160 nm with a minimum space of 160 nm as shown in FIG. 2(A).

Then, a processing parameter 5 necessary for generating complementary mask data is read in processing parameter reading S2. The processing parameter 5 here includes a dimension from a corner figure to a boundary of 50 nm, a dividing dimension of a long side pattern of 300 nm, and a minimum space of 60 nm and a minimum pattern dimension of 160 nm as a mask inspection rule. The boundary is a figure with an area here, and its width of 10 nm is read.

After reading the layout data and processing parameter, in pattern classification S3, a layout pattern is classified into a rectangle P1 formed by oblique lines with a pattern width of 160 nm or more to 200 nm or less, a rectangle P2 parallel to x and y axes with a pattern width of 160 nm or more to 200 nm or less (FIG. 2(B)), and other polygons, that is, a corner polygons P3 (FIG. 2(C)). There are various kinds of pattern classification, and classification described below is an example of them. After OR operation of an input pattern, a rectangle formed by parallel and opposed sides with a pattern width of 160 nm or more to 200 nm or less is extracted, and the rectangle extracted is subtracted from the input pattern to thereby extract a corner polygons P3.

Figure 3:
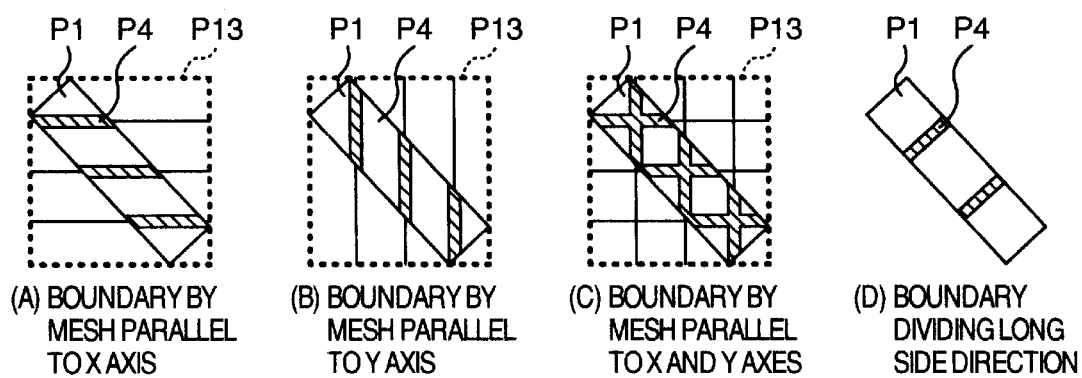
FIG. 3 is a plan view and illustrates a method of creating a boundary in a rectangle formed by oblique lines.

Next, in boundary creation S4, a boundary is created for classified rectangles. For the rectangle PI formed by the oblique lines among the rectangles, as shown in FIG. 3(A), a rectangle P13 surrounding the rectangle is obtained, a 10 nm wide mesh parallel to the x axis is created in the rectangle P13, and a portion overlapping the rectangle formed by the oblique lines is determined as a boundary P4. As shown in FIGS. 3(B) and 3(C), the mesh created in the rectangle P13 surrounding the rectangle PI may be parallel to the y axis, or x and y axes. In the mesh parallel to the x and y axes, an interval between meshes parallel to the x axis and an interval between meshes parallel to the y axis may be different. The boundary P4 may be created that divides a long side direction of the rectangle as shown in FIG. 3(D).

In the rectangle parallel to the x and y axes, a mesh dividing the long side direction is created in each rectangle at 300 nm intervals to be a boundary P5. For the corner graphics P3, as shown in FIG. 6, a common area to a doughnut pattern formed by figure P11 obtained by enlarging the corner graphics P3 by 50 nm and figure P12 obtained by enlarging the corner graphics P3 by 60 nm, and to the input pattern is determined as a boundary P6 (FIG. 2(E)).

Figure 2:
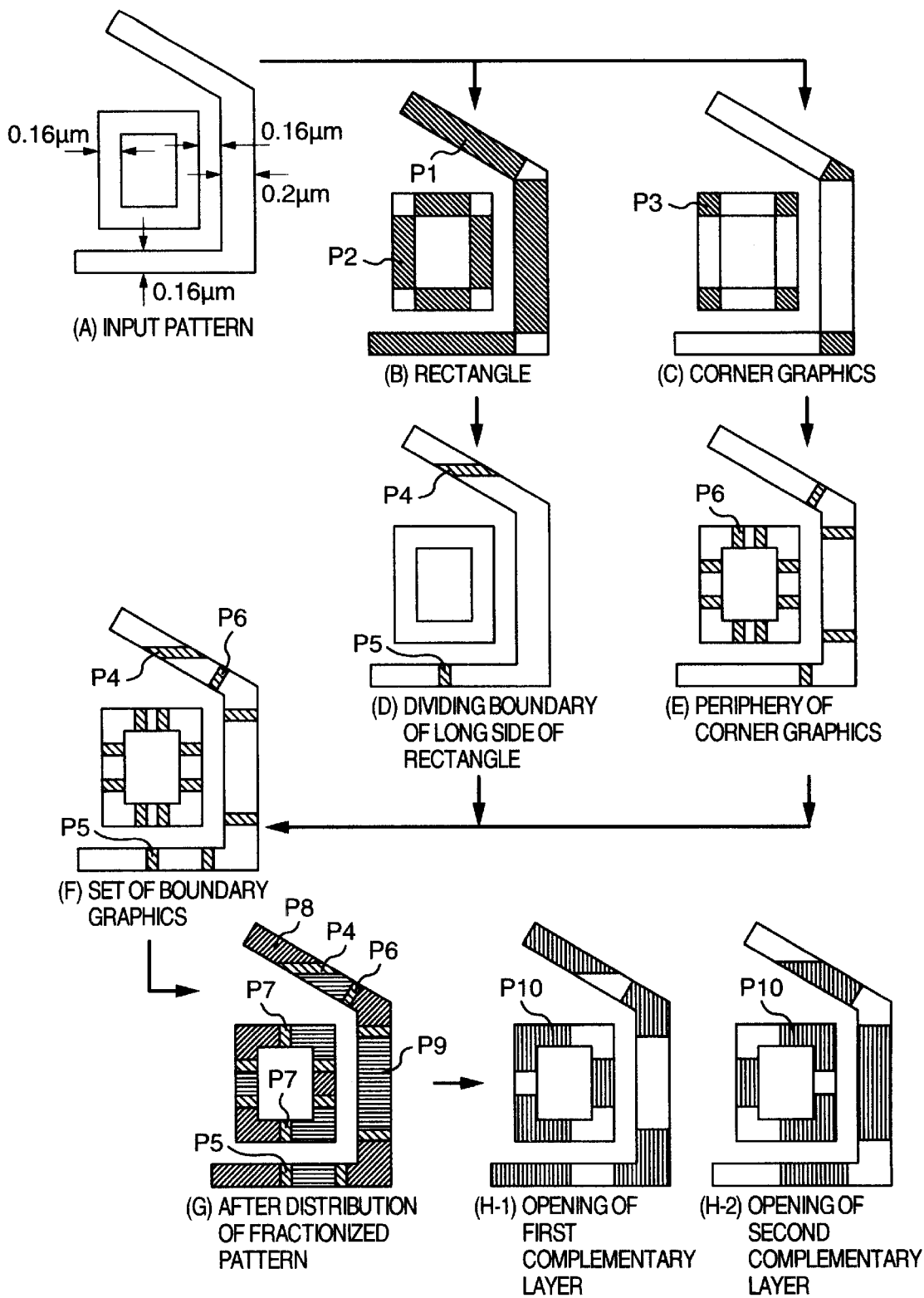
FIG. 2 is a plan view of a pattern and shows a flow of processing in Embodiment 1.

A set of all the boundaries P4, P5, P6 is as shown in FIG. 2(F). Then, in fractionized pattern generation S5, the input pattern is divided by the boundary to generate fractionized patterns. A minimum pattern dimension input as a mask inspection rule is 160 nm or more, so that when an interval between the boundaries is smaller than 160 nm, a new boundary P7 is created between two boundaries, and the former close boundaries are deleted. Then, in complementary layer generation S6, the fractionized patterns adjacent to both sides of the boundaries P4, P5, P6, P7, respectively are distributed into different layers, and thus a first layer pattern P8 and a second layer pattern P9 are obtained as shown in FIG. 2(G). A first complementary layer is OR of the first layer pattern P8 and the boundaries P4, P5, P6, P7 to be FIG. 2(H-1). A second complementary layer is OR of the second layer pattern P9 and the boundaries P4, P5, P6, P7 to be FIG. 2(H-1).

Further, in test S7, it is checked whether OR of the first complementary layer and the second complementary layer matches the input layout pattern in FIG. 2(A), whether the overlap between the first complementary layer and the second complementary layer is 10 nm, whether the interval between the patterns in each complementary layer meets the minimum space dimension of 60 nm of the mask inspection rule, and whether the doughnut pattern does not exist in each complementary mask. As a result, it is found that none of the first complementary layer and the second complementary layer includes position against the rule and doughnut pattern.

Finally, complementary mask data 6 is output in complementary layer output S8.

In the above described processing, the boundary is created that divides the rectangle formed by the oblique lines or the rectangle parallel to the x and y axes, but without this processing, the pattern may be fractionized simply by boundary at the corner. Fractionizing by the boundary at the corner can reduce the amount of data after division. On the other hand, when the boundary is provided that divides the rectangle formed by the oblique lines or the rectangle parallel to the x and y axes, both of the two complementary masks may have the same area ratios, pattern degradation can be prevented that may occur due to larger influence of Coulomb effect on either of the masks, and flexion can be also prevented that may occur when the rectangle has long sides.

In order to prevent generation of fractionized patterns smaller than the predetermined dimension, the boundaries are merged to remove a minute pattern that may cause difficulty in a mask inspection, but this processing may be omitted to reduce data generation and processing time. Further, deleting the minute pattern before generating the complementary layer can more significantly reduce the number of fractionized patterns in distribution into the complementary layer and reduce processing time of distribution into the complementary layer. However, the deletion may be performed after generating the complementary layer to delete the minute pattern from the layer including the same and to merge the minute pattern into another layer. The minute fractionized pattern may be merged in generating the fractionized pattern and also after generating the complementary layer.

In the above described embodiment, the boundaries are the figures with the areas, but all the boundaries may be lines. When the boundaries are lines, the first layer pattern P8 and the second layer pattern P9 may be the first complementary layer and the second complementary layer as they are.

Pattern dimensions or parameters other than the values mentioned above can be applied.

The complementary layer generation S6 may be directly performed after creation of the boundary without the fractionized pattern generation S5, and the interval between the boundaries may be simply checked to merge close boundaries without the input pattern fractionized at the boundary. Without the fractionized pattern generation, the time for this processing is eliminated, and checking the interval between the boundaries can prevent occurrence of the minute pattern.

(Embodiment 2)

In this embodiment, a case of changing a dividing dimension of a long side pattern depending on widths of patterns to be divided will be described. An input pattern is a second wiring layer pattern of a CMOS large-scale integrated circuit (LSI). Part thereof is used for description here. As shown in FIG. 5(A), 200 nm wide and 400 nm wide wiring patterns are arranged at 200 nm intervals.

After layout data reading S1, in processing parameter reading S2, a dividing dimension of a long side pattern of 1000 nm for a 200 nm wide line, a dividing dimension thereof of 1500 nm for a 400 nm wide line, a width of a boundary of 10 nm that is a graphics having an area, a dimension from a corner to a boundary of 50 nm, and a minimum space of 60 nm and a minimum pattern dimension of 160 nm as a mask inspection rule are read.

In pattern classification S3, rectangles with a long side in an x axis direction are classified according to width, and the remaining patterns, that is, rectangles with a long side in a Y axis direction are also classified according to width. As a result, the input patterns can be classified into a 200 nm wide rectangle P15 with a long side in the x axis direction (FIG. 5(B)), a 400 nm wide rectangle P16 with a long side in the x axis direction (FIG. 5(C)), a 200 nm wide rectangle P17 with a long side in the y axis direction (FIG. 5(D)), and a 400 nm wide rectangle P18 with a long side in the y axis direction (FIG. 5(E)). Methods for extracting these patterns include, for example, a method in which a patterns is first reduced by 100 nm in the x axis direction by directional sizing processing, and then the resulting patterns is enlarged by 100 nm in the x axis direction to obtain the rectangles with the long side in the x axis direction, which are classified according to width.

Then, in boundary creation S4, boundaries P19 are created at connecting portions of vertical patterns and lateral patterns as shown in FIG. 5(F) by a common area to a doughnut shape formed by enlarging the rectangles with the long side in the x axis direction of FIGS. 5(B) and 5(C) by 10 nm and subtracting an original pattern therefrom and to the input pattern. The boundaries P19 are also created as shown in FIG. 5(G) at 100 nm intervals in the 200 nm wide rectangles P15 and P17 of FIGS. 5(B) and 5(D). Likewise, the boundaries P19 are created as shown in FIG. 5(H) at 1500 nm intervals in the rectangles P16 and P18 with the width of 400 nm.

The input pattern is fractionized at the boundaries P19 of FIGS. 5(F), 5(G) and 5(H), and fractionized patterns are distributed in such a manner that adjacent patterns via the boundary are in different layers to obtain a first layer pattern P8 and a second layer pattern P9 as shown in FIG. 5(I).

Next, in test S7, a test is performed with OR of the first layer pattern P8 and the boundary P19 as a first complementary layer and with OR of the second layer pattern P9 and the boundary P19 as the second complementary layer to find that no test items has problems similarly to Embodiment 1.

However, when a stencil complementary mask is created using this data to perform an experiment on double exposure, a gap is generated between a latent image in first exposure and a latent image in second exposure because of insufficient alignment accuracy of an electron beam projection and exposure apparatus.

Figure 4:
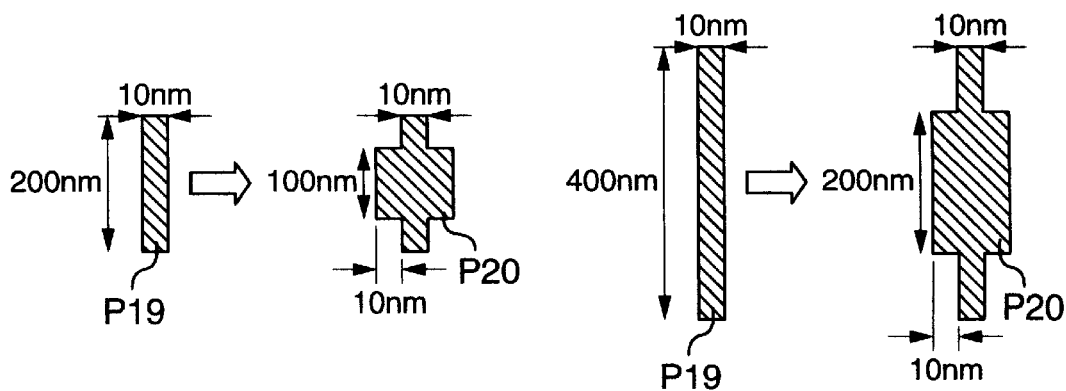
FIG. 4 is a plan view of an example of a pattern obtained by deforming a boundary.

Thus, in order to broaden the overlap between the first complementary layer and the second complementary layer, for only the layer of the boundary P19 created by the former processing, a boundary P20 having a protrusion at its center is created by pattern operation as shown in FIG. 4.

A new first complementary layer is obtained from OR of the boundary P20 and the first layer pattern P8 generated by the former processing, and likewise, a new second complementary layer is obtained from OR of the boundary P20 and the second layer pattern P9 generated by the former processing. A stencil mask is created in accordance with complementary mask data newly generated to perform an exposure experiment, thereby obtaining a resist pattern without breaking of a wire.

In this way, the boundary and the pattern after distribution are in different layers, so that a complementary mask with higher alignment accuracy can be created simply by processing the boundary layer without need for performing again the data processing from the beginning. The boundary has the graphics with the area, so that the boundary can be processed by a general pattern operation program.

In the above described method, the mask data is generated again in both complementary masks, but the data may be generated again for one mask only by changing the boundary shape. Generating the data again for one mask only can reduce data generation and processing time and time for generating the mask again. When the data and masks of both complementary layers are generated again, protruded patterns are connected to thereby increase connection accuracy.
(Embodiment 3)

In this embodiment, taking a pattern as shown in FIG. 7(A) with 200 nm wide and 400 nm wide patterns arranged at 200 nm or 400 nm intervals as an example, and a case of reducing a long side dividing dimension of a pattern adjacent to a narrow interval between patterns will be described.

After layout data reading S1, in processing parameter reading S2, a long side dividing dimension of 1200 nm for patterns arranged at 200 nm or smaller intervals, and a long side dividing dimension of 2200 nm for other patterns, a width of a boundary figure of 10 nm, and a minimum space of 60 nm and a minimum pattern dimension of 200 nm as a mask test rule are read.

In pattern classification S3, areas P21 with 20 nm or smaller spaces between patterns are extracted as shown in FIG. 7(B), and patterns adjacent thereto are obtained as shown in FIG. 7(C).

Next, in boundary creation S4, boundaries P19 are created at 1200 nm intervals in the pattern of FIG. 7(C) as shown in FIG. 7(D). In patterns other than the pattern P22 of FIG. 7(C), the boundaries P19 dividing the patterns at 2200 nm intervals are created as shown in FIG. 7(E).

In fractionized pattern generation S5, an input pattern is fractionized, and in complementary layer generation S6, fractionized patterns are distributed in such a manner that adjacent fractionized patterns are in different layers to obtain a first layer pattern P8 and a second layer pattern P9 as shown in FIG. 7(F). Then, in test S7, it is checked whether OR of the first complementary layer P8 and the second complementary layer P9 matches the input layout pattern in FIG. 7(A), whether the first layer pattern P8, the second layer pattern P9, and the boundary P19 have no overlap, whether the interval between the fractionized patterns meets a minimum pattern dimension of 200 nm and a minimum space dimension of 60 nm of a mask inspection rule, and whether a doughnut pattern does not exist in each complementary mask. As a result, it is found that there is no problem.

Figure 13:
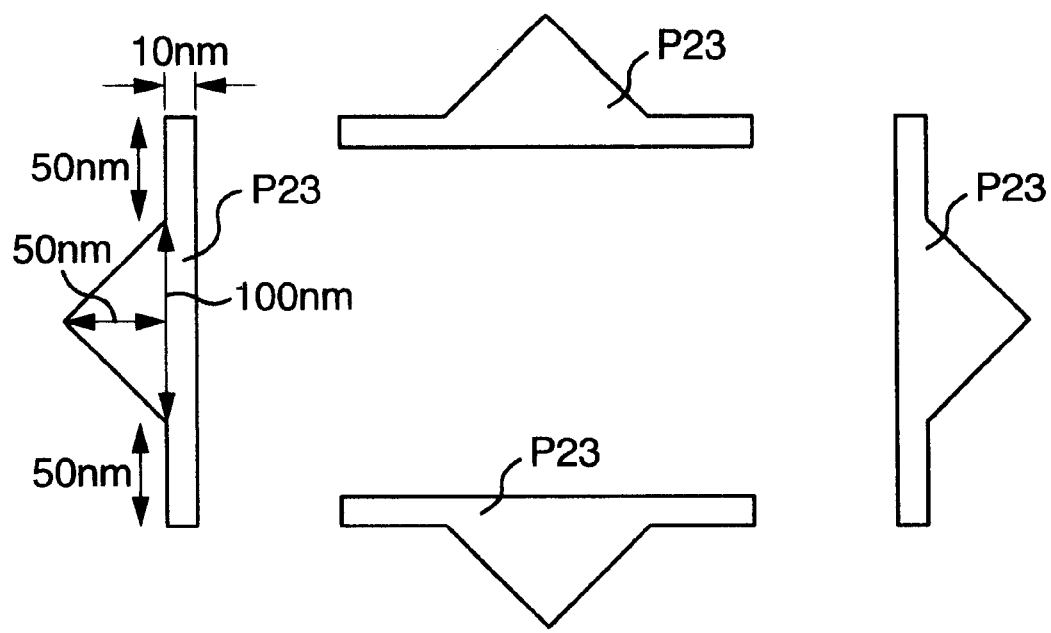
FIG. 13 shows a shape of a cell projection aperture seen from above.
Figure 17:
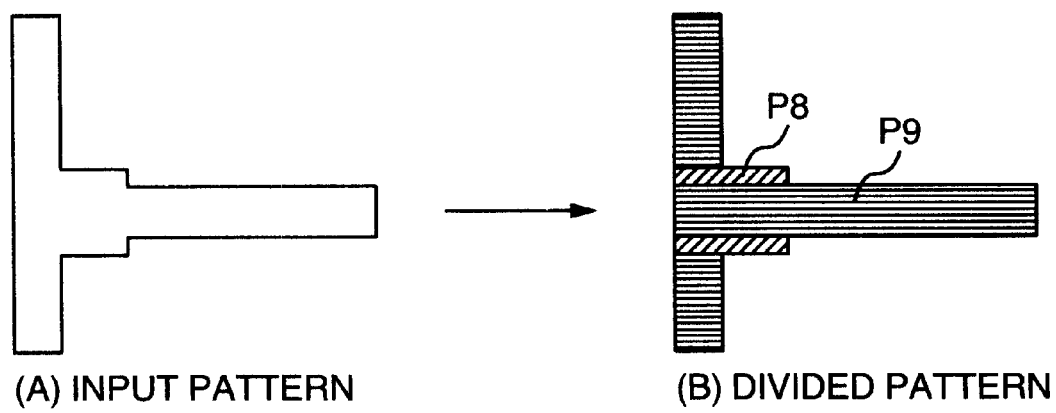
FIG. 17 is a plan view of a pattern and illustrates a problem of conventional technique.

For creating a stencil mask using this data, a first stencil mask substrate coated with resist is prepared. Data of the first layer pattern P8 is converted to variable formation drawing data and drawn, and for boundary figure portions, cell projection drawing is performed. Specifically, cell projection apertures P23 having different protrusion directions as shown in FIG. 13 are prepared, and in the boundary graphics portion, a cell projection aperture P23 is selected in such a manner that a protrusion does not overlap the first layer pattern P8 for drawing. In the boundary graphics portion in the 400 nm wide pattern, the cell projection aperture P23 and a variable formation aperture are combined for drawing. Likewise, on a second stencil mask substrate, data of the second layer pattern P9 and data of the boundary layer is used for drawing to thereby obtain a satisfactory stencil mask.

Using the two masks, first exposure is performed on a wafer coated with resist by a first stencil mask, and then second exposure is performed by a second stencil mask. After heat treatment and development, satisfactory resist pattern is obtained. Then a satisfactory device pattern is obtained by etching.

In the above described stencil mask creating, both of the first and second stencil masks have the boundary graphics portions formed to protrude at the center thereof using the cell projection aperture. However, the cell projection aperture may be used for the boundary figures portion of one stencil mask only, and for the other stencil mask, drawing may be performed by rectangular boundary data. The boundary may be used as it is for both stencil masks. When both stencil masks have the protrusions at their center, increase in connection accuracy can be expected. When a rectangular boundary is used as it is, a rectangle can be drawn together with the pattern adjacent to the boundary, thereby reducing mask drawing time. When mask drawing is performed by a cell projection aperture having a protrusion at its center on one mask only, the mask can be created in shorter time than when both of the cell projection masks have the protrusions, and the connection accuracy increases more than when the mask is created by both rectangular boundary.

(Embodiment 4)

In this embodiment, a case where a narrow interval between patterns is a boundary will be described.

After reading the same pattern (FIG. 14(A)) as Embodiment 3 in layout data reading S1, in processing parameter reading S2, every other pattern adjacent to an area with a 200 nm or smaller interval between patterns are designated to be distributed into a complementary mask. For the other patterns, a long side dividing dimension is designated as 2200 nm, and a width of a boundary figure is designated as 10 nm. A minimum space of 60 nm and a minimum pattern dimension of 200 nm as a mask test rule are read.

In pattern classification S3, areas P21 with 200 nm or smaller spaces between patterns are extracted as shown in FIG. 14(B) similarly to Embodiment 3. Patterns P42 not adjacent to the areas P21 are obtained as shown in FIG. 14(C).

Then, in boundary creation S4, boundaries P19 are created at 2200 nm intervals in the pattern P42 as shown in FIG. 14(D). In layers different from the layer of the boundary P19, the areas P21 with 200 nm or smaller spaces between patterns of FIG. 14(B) are determined as boundary.

In fractionized pattern generation 5, an input pattern is fractionized using the boundary P19, and the boundary adjacent to a pattern smaller than a minimum pattern dimension of 200 nm of a mask inspection rule is deleted.

Then, in complementary layer generation S6, the patterns are distributed into the boundary P19 and the area P21 with 200 nm or smaller space between the patterns in such a manner that the patterns on both sides are in different layers to obtain a first layer pattern P8 and a second layer pattern P9 and the boundary P19 as shown in FIG. 14(E). A first complementary layer is OR of the first layer pattern P8 and the boundary P19, and a second complementary layer is a pattern P9. Further, in test S7, it is checked whether OR of the first complementary layer P8 and the second complementary layer P9 matches the input layout pattern in FIG. 14(A), whether the first complementary layer and the second complementary layer has no overlap, and whether patterns with a dimension less than a minimum pattern dimension or with a dimension less than a minimum space dimension do not exist. As a result, it is found that there is no problem in any of them.

In the above described embodiment, every other pattern to be an opening adjacent to the area smaller than a designated interval is distributed into the complementary layer, but the boundary may be generated in such a manner that the pattern smaller than a predetermined dimension between areas smaller than a designated pattern interval is distributed into the complementary layer. When every other pattern adjacent to the area smaller than the designated interval is distributed into the complementary layer, and an area P49 smaller than the interval designated in the pattern as shown in FIG. 22(A) is set as shown in FIG. 22(B), and the complementary layers as shown in FIGS. 22(C-1) and 22(C-2) are obtained, and none of the complementary layers has thin lines that may cause flexion on the stencil mask. On the other hand, the every other pattern between the areas P49 smaller than the designated interval is distributed into the complementary layer, and the boundaries are provided in the other patterns, thereby obtaining substantially equal area ratios of both complementary masks as shown in FIGS. 22(D-1) and 22(D-2).

(Embodiment 5)

In this embodiment, a case of reading a CMOS logic LSI transistor gate layer and designating an active area of a transistor as a pattern division prohibiting area will be described.

In layout data reading S1, a gate pattern P24 having 160 nm and 200 nm wide gate lines on the active area and 200 nm wide wiring on a field area (area other than the active area) are read as shown in FIG. 8(A). In processing parameter reading S2, an active area pattern P25 is read, and a division prohibiting area value from the active area of 200 nm is read.

After OR operation of the gate pattern P24 in pattern classification S3, a rectangle P26 (FIG. 8(B)) formed by a pair of parallel and opposed sides at a 160 nm or greater to less than 200 nm interval is extracted, and from the remaining patterns, a rectangle P27 (FIG. 8(C)) formed by a pair of parallel and opposed sides at a 200 nm or greater interval is extracted. These patterns P26, P27 are subtracted from an input pattern to obtain a corner graphics P28 as shown in FIG. 8(D).

Then, in boundary creation S4, the corner polygons P28 of FIG. 8(D) is used as a boundary P19 as it is. However, as shown in FIG. 8(E), a corner polygon within a pattern P29 obtained by enlarging the active area pattern P25 by 200 nm is deleted to obtain the boundary P19. Next, in complementary layer generation S6, the patterns are distributed into a first layer pattern P8 and a second layer pattern P9 in such a manner that the patterns P24 on both sides of the boundary P19 are in different layers to obtain a result as shown in FIG. 8(F). Then, the boundary P19 is merged into the distributed first layer pattern P8 to obtain data of a first complementary layer pattern and a second complementary layer pattern as shown in FIGS. 8(G-1) and (G-2).

Next, in test S7, it is checked whether OR of the first complementary layer pattern and the second complementary layer pattern matches the input layout pattern, whether the first complementary layer pattern and second complementary layer pattern have no overlap, whether the interval between the fractionized patterns meets a minimum pattern dimension and a minimum space dimension of a mask test rule, and whether the doughnut pattern does not exist in each complementary mask. As a result, it is found that there is no problem.

According to this embodiment, no boundary exists on the active area, so that no change in width of the gate line occurs due to connection error at a connecting portion of the complementary layer, thereby obtaining satisfactory transistor properties.

Figure 23:
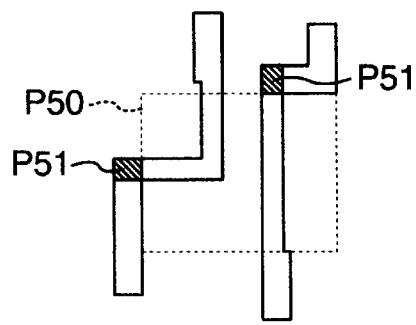
FIG. 23 is a plan view of a pattern and illustrates a corner graphics that is extracted when a boundary in a pattern division prohibiting area is removed in boundary creation, but is not extracted when the boundary in the pattern division prohibiting area is removed after layout data reading.

Processing of pattern division prohibiting area is performed in the boundary creation S4 here, but the pattern in the pattern division prohibiting area may be removed immediately after the input layout data reading, and after processing of the pattern classification S3 and boundary creation S4, the pattern in the pattern division prohibiting area formerly removed may be merged to perform the complementary layer generation S6 and test S7. When the pattern in the pattern division prohibiting area is removed immediately after the input layout data reading, the number of patterns in the subsequent processing is reduced to thereby reduce processing time. On the other hand, when the boundary in the pattern prohibiting area is removed in the boundary creation, a corner graphic P51 adjacent to a pattern prohibiting area P50 may be extracted as a corner graphics as shown in FIG. 23.

(Embodiment 6)

Figure 9:
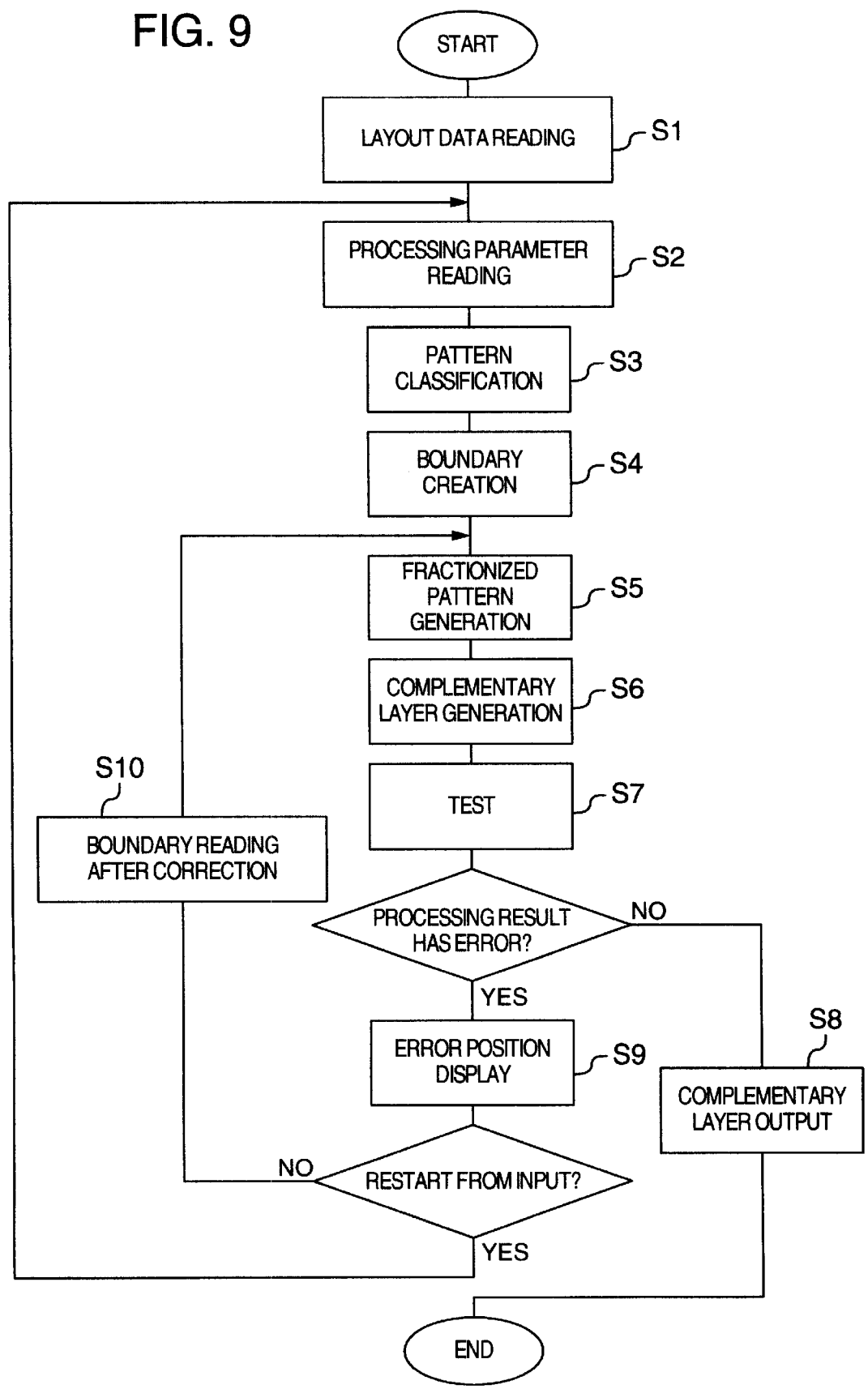
FIG. 9 is a processing flow according to Embodiment 6.

In this embodiment, a method in which a user inputs change of division of error positions when a result of complementary mask creation processing has errors will be described with reference to a flow in FIG. 9.

In processing parameter reading S2, a dividing dimension of a long side pattern of 600 nm, a dimension from a corner to a boundary figure of 40 nm, a minimum space of 50 nm and a minimum pattern dimension of 200 nm as a mask test rule are read. Pattern classification S3, boundary creation S4, fractionized pattern generation 5, complementary layer generation S6, and test S7 are performed similarly to Embodiment 1 to thereby detect one error.

Figure 10:
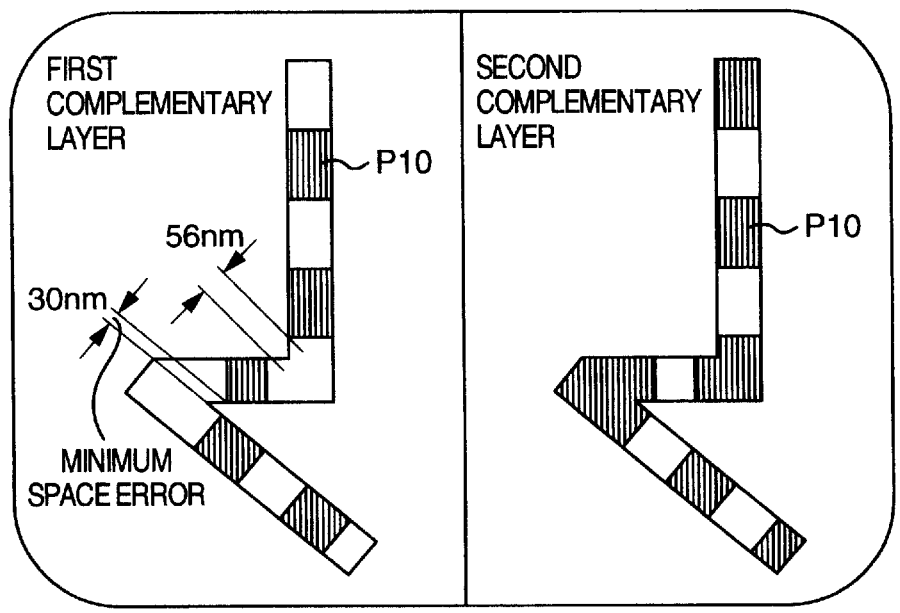
FIG. 10 shows a screen display example of a plan view of a pattern of a complementary mask.

Then, in error position display S9, an error position is displayed as shown in FIG. 10. This error occurs because a distance of the corner to a boundary is 40 nm and the minimum space dimension is 50 nm in the layer during the test, so that the minimum space dimension cannot be met when the patterns are connected with an acute angle less than 90°.

Figure 11:
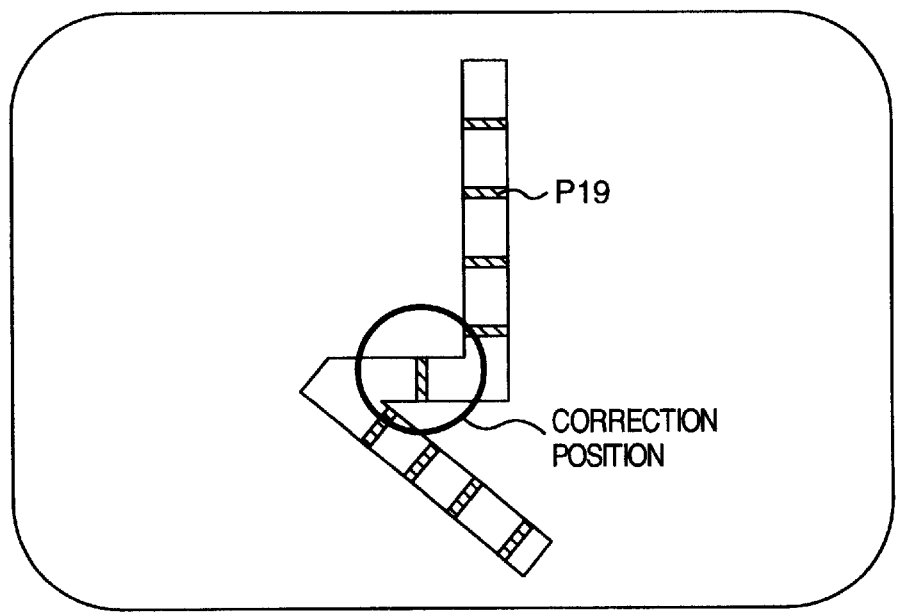
FIG. 11 shows a screen display example of a plan view of a corrected boundary.

The user may select restarting from input of the processing parameter or correcting the boundary to restart form the fractionized pattern generation S5. Here, correcting the boundary is selected to display the boundary used in the processing when the error occurs, and then the user inputs correction as shown in FIG. 11 (layout data reading S10 after correction).

The corrected boundary is input in the fractionized pattern generation S5 and complementary layer generation S6 for processing, and through the test S7, complementary mask data without errors can be generated.

(Embodiment 7)

In this embodiment, a case where first complementary layer data is generated from a corner polygons, second complementary layer data is other than the corner polygons, and a complementary layer is generated by classification of an input pattern rather than by use of the boundary will be described. Further, creating a stencil mask using these data will be described.

After reading a pattern with a minimum line width of 200 nm, a minimum space of also 200 nm, and a maximum pattern width of 300 nm as shown in FIG. 12 (A), an enlarged dimension of the corner graphics of 100 nm as a processing parameter, and a minimum space of 100 nm and a minimum pattern dimension of 200 nm as a mask test rule are read.

Then, after OR operation of the input pattern, a rectangle P30 formed by a pair of parallel and opposed sides at a 200 nm and greater to 300 nm or smaller interval is extracted as shown in FIG. 12(B). This pattern is removed from the input pattern to obtain a corner polygons P31 as shown in FIG. 12(C). A common area to a pattern obtained by enlarging the corner polygons P31 by 100 nm and to the input pattern is obtained as shown in FIG. 12(D-1) to be first complementary layer data. Further, the first complementary layer data is removed from the input data to obtain second complementary layer data as shown in FIG. 12(D-2).

It is found that both of the first and second complementary data meet the mask inspection rule, so that the data is converted into electron beam drawing data for a 4× mask. Then, two Si mask substrates having thin pattern drawing portions with a 2 μm thickness are prepared, resist is coated on a first Si mask substrate to perform electron beam drawing with the first complementary layer data, and after development of the resist, the Si mask substrate is etched to create a first stencil mask. Likewise, resist is coated on a second Si mask substrate to perform electron beam drawing with the second complementary layer data, development, and etching to thereby obtain a second stencil mask.

As a result of a dimension/defect test of the stencil mask, it is found that both of the first and second stencil masks are satisfactory.

(Embodiment 8)

In this embodiment, a case of classifying input layout data according to width, and distributing the data into a complementary mask according to a long side direction of patterns classified according to the width will be described.

Input layout data of a pattern width of 200 nm or more to 400 nm or less as shown in FIG. 15(A) is read, and after OR processing of the pattern data, a rectangle P32 formed by a pair of parallel and opposed sides at a 200 nm or more to less than 300 nm interval is extracted (FIG. 15(B)). Further, a rectangle P33 with a 300 nm or more to less than 500 nm width is extracted as shown in FIG. 15(C). Then, a rectangle P34 with a long side in an x axis direction is extracted from the rectangle P32 with a 200 nm or more to less than 300 nm width, and a rectangle P35 with a long side in an x axis direction is extracted from the rectangle P33 with the 300 nm or more to less than 500 nm width to obtain patterns as shown in FIG. 15(D).

The patterns of FIG. 15(D) obtained are determined as first complementary layer data (FIG. 15(E-1)) and the other patterns are determined as second complementary layer data as shown in FIG. 15(E-2). Based on the data, two stencil masks are created.

An Si wafer coated with resist is set on a stage of an electron beam projection and exposure apparatus, and a first stencil mask is set on a mask holder. A chip mark on the wafer is aligned with a mark of the first stencil mask to expose for a first exposure amount. Then, the first stencil mask is replaced by a second stencil mask, and a chip mark on the wafer is aligned with a mark of the second stencil mask to expose for a second exposure amount. The first exposure amount and the second exposure amount may be identical.

Then, development is performed to obtain a resist pattern, the wafer having an insulation film, semiconductor film, or metal film as a mask is etched to obtain a satisfactory device pattern. Especially, a device shape is obtained that is effective in a line based minute pattern such as a wiring layer or gate layer and has high accuracy without difference in dimension between dense and isolated lines.

(Embodiment 9)

In this embodiment, a method of dividing into a complementary layer using a line boundary will be described. A case of not dividing a gate pattern portion drawn with a thinner rule than a field wiring will be taken as an example.

Data read in layout data reading S1 includes dimensions of a gate portion on an active area of 100 nm, a field wiring of 50 nm, and a dogbone of 200 nm as shown in FIG. 16(A). In processing parameter reading S2, a dimension from the corner polygon to boundary of 50 nm and data of not dividing thin line portions of 100 nm are read. A minimum space of 60 nm and a minimum pattern dimension of 160 nm as a mask inspection rule are designated.

Next, in pattern classification S3, a rectangle P36 with a 100 nm or more to less than 150 nm width (FIG. 16(B)) and a rectangle P37 with a 150 nm or more to less than 200 nm width (FIG. 16(C)) are extracted, and these rectangles are subtracted from the input pattern to obtain a patterns P38 as shown in FIG. 16(D).

In boundary creation S4, in a patterns P39 obtained by enlarging the patterns P38 by 50 nm, a side of a portion in the input pattern other than the rectangle P36 is determined as a boundary line P40, and a side where the rectangle P36 touches other pattern is determined as a boundary line P41.

The input pattern is fractionized using the boundary lines P40, P41, and boundary lines are deleted so as to eliminate a fractionized pattern having a side smaller than a minimum pattern dimension of 160 nm of the mask inspection (fractionized pattern generation S5).

Next, in complementary layer generation S6, the fractionized patterns on both sides of the boundary are distributed into different layers to thereby obtain a first layer pattern P8 and second layer pattern P9 as shown in FIG. 16(H). For the complementary mask, data with openings as shown in FIGS. 16(I-1) and 16(I-2) is obtained.

As a result of test S7, it is found that no test item has problems in both of the first complementary layer and the second complementary layer.

(Embodiment 10)

In this embodiment, an example where an area ratio of a complementary mask is set below a predetermined value when an area within a Coulomb effect influence range is provided around any chosen point in a mask.

A study is performed on dividing a pattern with line patterns having a minimum line width of 70 nm arranged at minimum spaces of 70 nm in a 50 $\mu$m×100 $\mu$m area on the mask. In the 50 $\mu$m×100 $\mu$m area, an area ratio of the pattern is 50%. This input pattern includes no doughnut pattern, and a sufficient dividing dimension for preventing flexion of the pattern is about 15 $\mu$m. Thus, the pattern is divided with 15 $\mu$m dividing pitch. In the complementary mask pattern obtained, each divided pattern of 15 $\mu$m has 70 nm line and space.

Electron beam projection lithography is performed using the complementary mask obtained by the division, but sufficient resolution as expected can not be obtained. This may be due to the influence of the Coulomb effect. A local Coulomb effect of the electron beam projection and exposure apparatus used in this embodiment may be produced in about 10 $\mu$m or greater area.

Thus, the dividing pitch is changed to 3 $\mu$m to perform similar mask dividing. The complementary mask after the change has a 30% or lower area ratio in an area within a 10 $\mu$m radius around any chosen point. Electron beam projection and exposure is performed using this mask to obtain resolution as expected.

(Embodiment 11)

In this embodiment, a case of taking out data of only an area having an area ratio of an input pattern more than a predetermined value within a Coulomb effect influence range in an input pattern area, and dividing the data into a complementary layer will be described.

Figure 18:
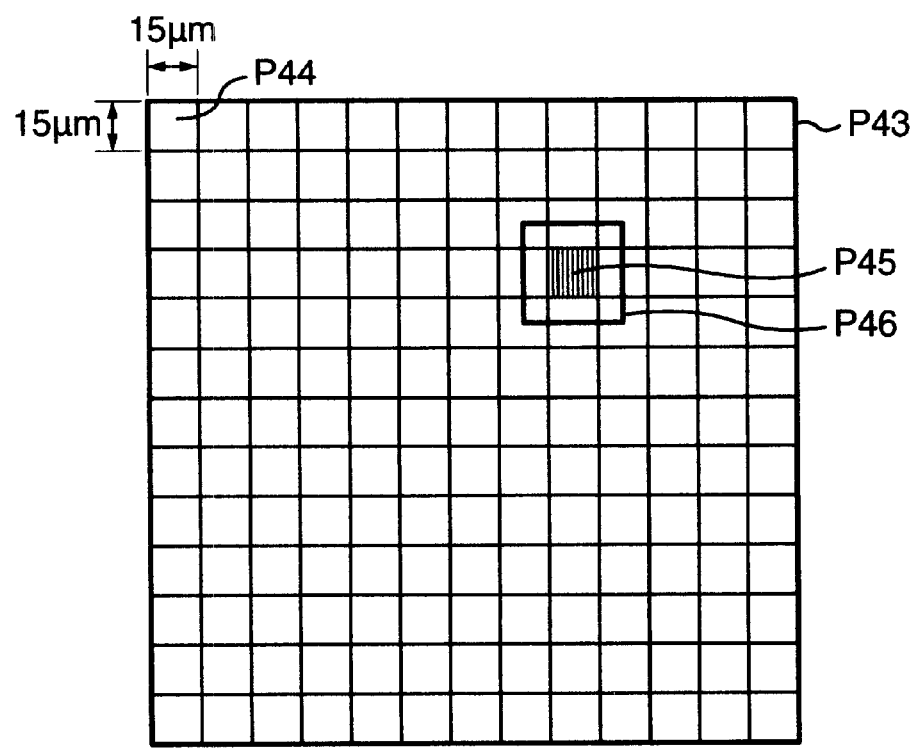
FIG. 18 is a plan view of a pattern area where complementary mask division is performed in Embodiment 11.

The Coulomb effect influence range of a lithography apparatus used here is about 15 $\mu$m square, so that an entire area P43 of the input data shown in FIG. 18 is divided into sub areas 44 of 15 $\mu$m square to check an area ratio of each sub area P44. As a result, it is found that the area ratio of the input pattern exceeds 30% in one sub area P45. Thus, as positions to be distributed into the complementary mask, all patterns in an area P46 obtained by enlarging the sub area P45 by 7.5 $\mu$m, all doughnut patterns in the entire area P43, and elongate patterns that may be flexed are extracted in the form of patterns to be divided. In the area P46, the mask is divided in such a manner that any 15 $\mu$m square of the Coulomb effect influence range has a 25% or lower area ratio in the range. For the extracted doughnut pattern and long side pattern, dividing processing into the complementary layer is performed, and the other patterns are included in one complementary layer to generate data.

In this embodiment, the dividing processing can be performed only for minimum patterns, thereby reducing time for mask dividing calculation.

(Embodiment 12)

In this embodiment, a method of distributing fractionized patterns on both sides of a boundary into different complementary mask layers will be described.

Here, for distribution, a pattern generating program that is used in applying a method known as a phase shift method in optical lithography to a logic gate is used. This method is known as a phase edge method and is such that when a gate of an MOS transistor is patterned, both sides of the gate are exposed to light of substantially opposite phases to form a dark line by phase compensation on a gate line, and the dark line is transferred to a resist film. For enormous gate patterns placed at random, a dedicated pattern operation tool is developed in order to generate a mask pattern having opposite phases on its both sides. For example, a pattern of phase 0 (opening) and a pattern of phase $\pi$ (opening) are generated in an area including an active area on both sides (the source side and the drain side of the MOS transistor) of the gate over the active area. One phase shift mask is formed to have the phase 0 opening and the phase $\pi$ opening, and transferred by a reduction projection and exposure apparatus, thereby forming a resist pattern for a fine gate on a wafer.

In this embodiment, a boundary pattern is input in a gate layer of the phase shift pattern generating program as a pattern to be divided by the boundary in the active area (the sum of the area of the fractionized pattern on both sides of the boundary and the boundary pattern), and output corresponding to phase 0 is used as a first complementary layer, and output corresponding to phase $\pi$ is used as a second complementary layer, or vice versa.

According to this embodiment, complementary mask data can be easily obtained without development of a new special program requiring development hours.

(Embodiment 13)

A case where a narrow interval between patterns is a boundary as in Embodiment 4, and a complementary mask is created by a method using a phase shift pattern generating program of Embodiment 12 will be described.

For the input pattern of FIG. 14(A), layout data reading S1, processing parameter reading S2, pattern classification S3, and boundary creation S4 are performed similarly to Embodiment 4.

Then, an OR pattern of an area P21 and a boundary P19 is input in a gate layer of the phase shift pattern generating program, and an OR pattern of the area P21 and the input pattern is input in an active area as a pattern to be divided by the boundary, and output corresponding to phase 0 is used as a first complementary layer, and output corresponding to phase $\pi$ is used as a second complementary layer, or vice versa.

As a result, complementary mask data similarly to Embodiment 4 can be easily obtained without development of a new complementary layer generating program.

(Embodiment 14)

Figure 19:
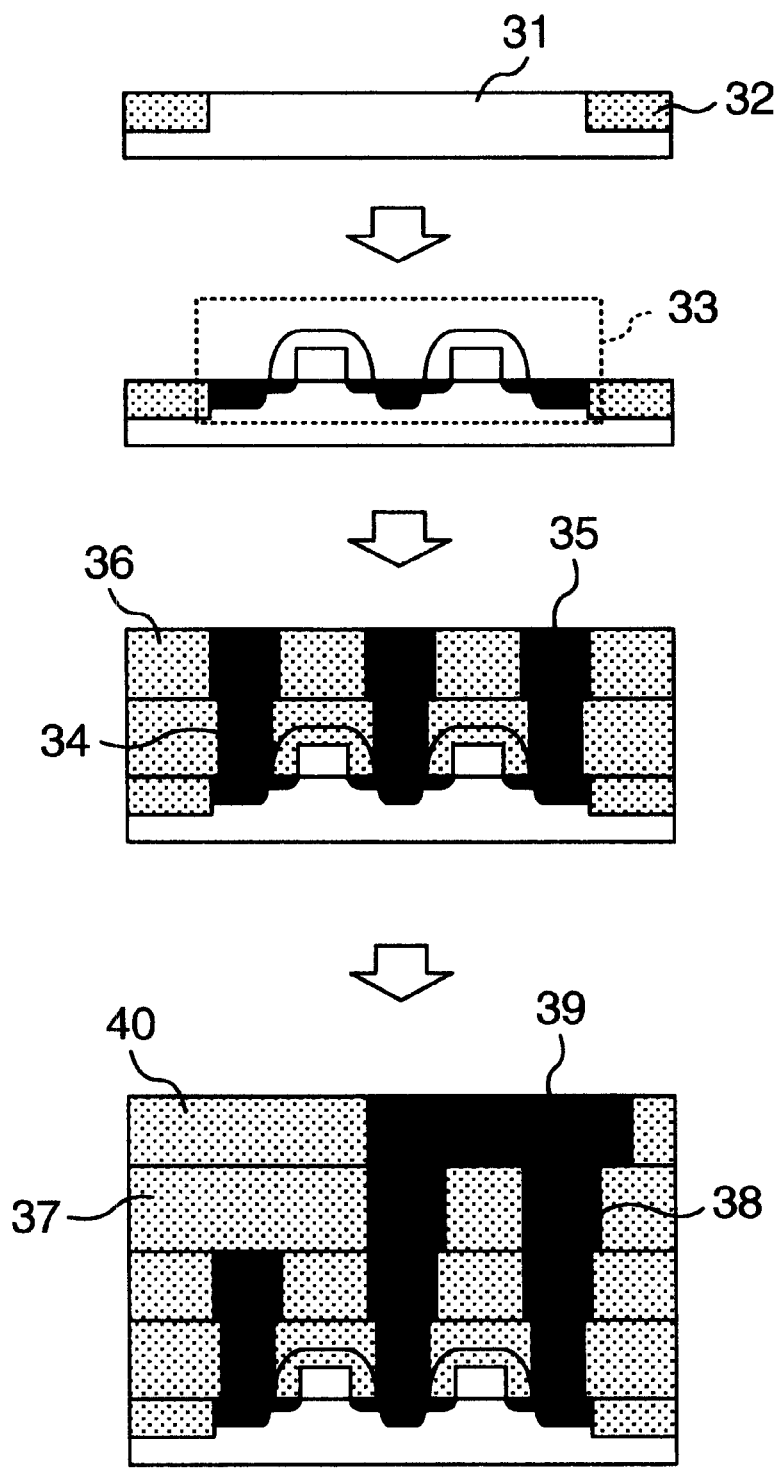
FIG. 19 is a sectional view of a semiconductor device and illustrates Embodiment 14.

In this embodiment, a production method of a semiconductor device using a complementary mask used in the above described embodiments will be described with reference to FIG. 19. FIG. 19 is a diagram of a manufacturing process of the semiconductor device (MOS logical LSI) with a sectional view of typical portions of a device. First, on an Si substrate 31, an element separating area 32 is formed (a first stage in FIG. 19), a MOS transistor 33 is formed (a second stage in FIG. 19), and a contact hole 34 is formed (a third stage in FIG. 19). Then, a first layer wiring 35 and an insulation film between wirings 36 are formed (the third stage in FIG. 19), on which an insulation film between layers 37 and a connecting hole 38, and further a second layer wiring 39 and an insulation film between wires 40 are formed (a fourth stage in FIG. 19). A third wiring and subsequent wirings (not shown) are similarly formed. In this embodiment, a similar method to that shown in Embodiment 4 is used for pattern forming in the element separating area 32 and the first and second wirings, and a similar method to that shown in Embodiment 5 is used for pattern forming in the MOS transistor 33.

Figure 21:
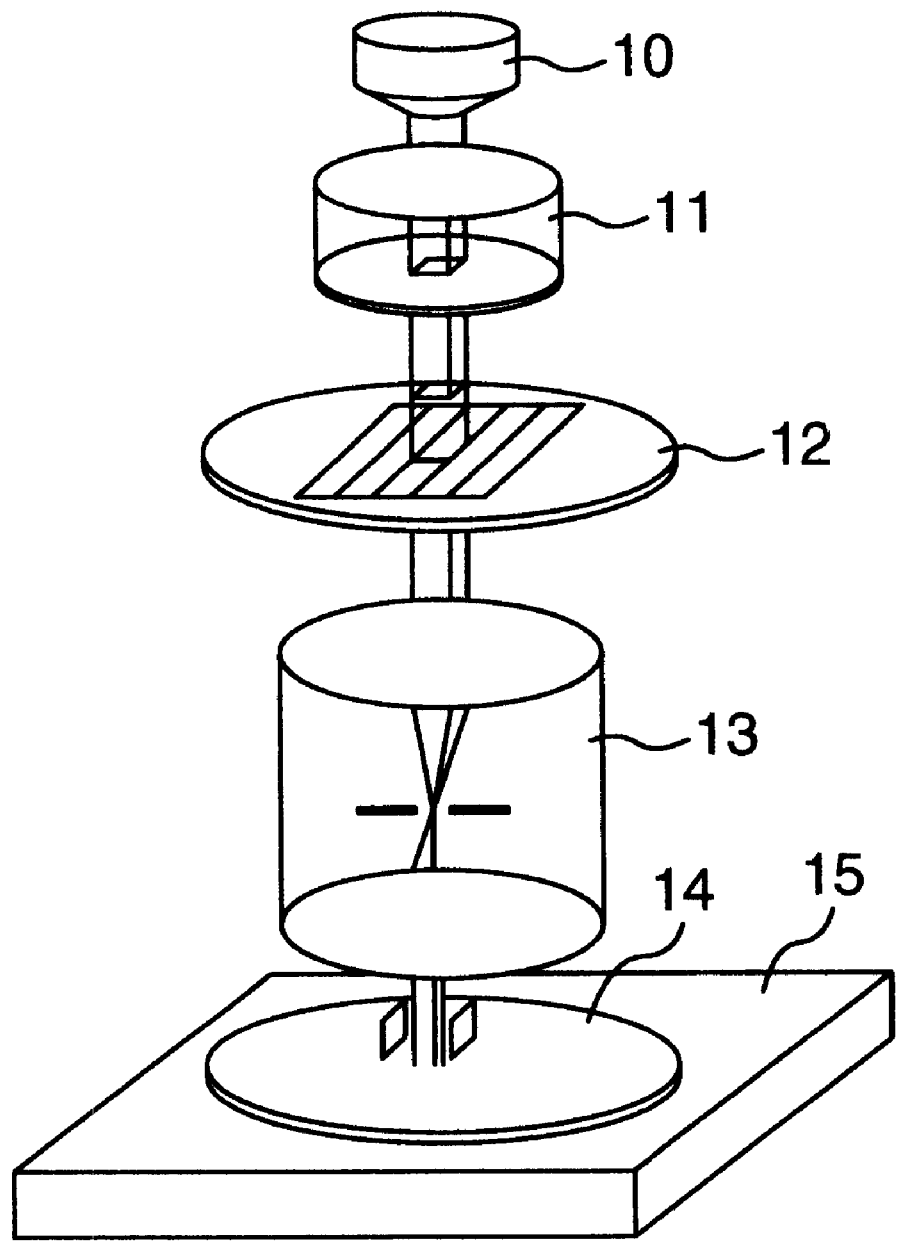
FIG. 21 is a schematic view of an electron beam projection and exposure apparatus.
Figure 24:
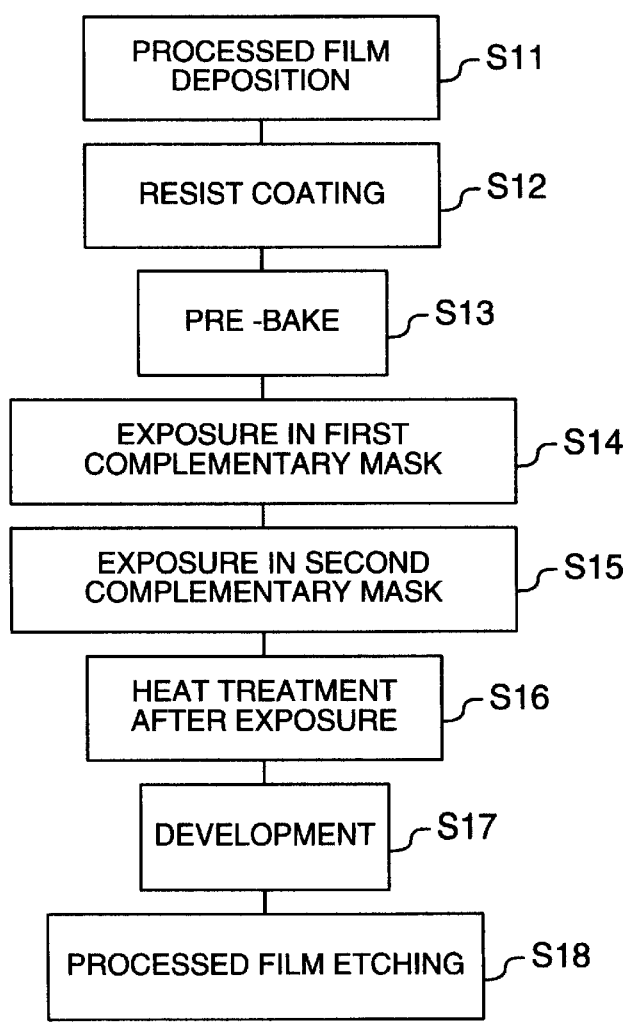
FIG. 24 is a flow of device manufacturing steps.

Now, a flow of detailed device manufacturing processing will be described with reference to FIG. 24, taking a gate pattern forming step as an example. First, on a wafer formed with the element separating area 32 and a gate oxide film, a 150 nm thick polycrystalline polysilicon film is deposited by CVD (Chemical Vapor Deposition) (deposition of processed film S11 in FIG. 24). Then, in resist coating S12, the processed film is spin coated with 0.3 μm thick chemical amplification negative resist SAL 601 manufactured by Shipley, and pre-bake S13 is performed at 100° C. for 2 minutes to form a resist layer. Then, a mask 12 created with complementary mask data generated in Embodiment 5 is set in an electron beam projection and exposure apparatus shown in FIG. 21, a first complementary mask area is scanned to expose a wafer 14 with a current value of 25 μA and a dose of 7 μC/cm², and a second complementary mask area is exposed over a first exposure area on the wafer with the same current value and the same dose. Then, heat treatment after exposure S16 is performed at 110° C. for 2 minutes, development S17 is performed by immersion for 2 minutes in MF-312 developer manufactured by Shipley to obtain a resist pattern. Next, polycrystalline silicon is etched with the resist pattern as a mask by a dry etching step corresponding to processed film etching S18, and the resist is removed to form a gate pattern. According to this embodiment, a semiconductor integrated circuit having a minute pitch wiring, which cannot be produced by a conventional optical exposure, can be produced with high accuracy, high yield and high throughput.

(Embodiment 15)

In this embodiment, a case of using a lattice like boundary will be described. Description will be made using a large pattern with a thick line as shown in FIG. 20(A).

As a boundary line, a line width direction (short side) is divided into two parts as shown in FIG. 20(B), and a lattice like boundary line P19 is created that divides a long side direction into two or more parts. Distribution into a complementary layer using the boundary line P19 is performed to obtain a first layer pattern P8 and a second layer pattern P9 as shown in FIG. 19(C). When the first layer pattern P8 and the second layer pattern P9 are used as complementary mask data as they are, some positions are detected as defects in a test in mask creation, so that a rectangle P47 having a side longer than a minimum space dimension of a mask test rule at an intersection portion of the lattice like boundary lines is created, and a pattern obtained by subtracting the rectangle P47 from a pattern P8 is determined as an opening of a first complementary layer (FIG. 20(E-1)), and a pattern obtained by subtracting the rectangle P47 from a pattern P9 is determined as an opening of a second complementary layer (FIG. 20(E-2)).

According to OR of the two complementary mask data, the position of the rectangle P47 does not match design data, and should be an area irradiated with no electron beam even by double exposure. However, in actual double exposure by an electron beam projection and exposure apparatus, the position corresponding to the pattern P47 on the wafer is photosensitized/developed by blur of the electron beam or chemical reaction in the resist to obtain a satisfactory pattern.

An opening pattern of the complementary layer is obtained here by subtracting the rectangle P47 from the patterns P8 and P9, but the rectangle P47 may be larger than a minimum pattern dimension of the mask test rule, and the sum of the pattern P8 or pattern P9 may be the opening pattern of each complementary layer.

The boundary P19 may be a graphics with a width and be substituted for the rectangle P47.

In the above embodiment, the short side direction is divided into two parts, but a boundary figure with both of the short side and long side divided into three or more parts may be provided to obtain complementary layer data by subtracting the boundary figure from the pattern P8 and pattern P9 after distribution into the complementary layer.

According to the present invention, a method of manufacturing of a semiconductor device with high dimensional accuracy using a stencil type complementary mask can be provided.

According to one embodiment, a long and thin line opening that may cause deformation on a doughnut pattern and a mask may be divided into two masks, and a uniform opening ratio of each complementary mask can be offered. Further, a boundary is formed to be a separate layer as a figure with an area, so that without restarting complementary mask data generation for improving alignment shift from the beginning, data with improved overlap of two complementary masks can be obtained by OR operation of deformation of the boundary graphics and the pattern distributed into two layers.

While the invention has been described in terms of its embodiments, those skilled in the art will recognize that various changes and modifications can be made in it within the spirit and scope of appended claims.

What is claimed is:

1. A method of manufacturing a semiconductor device, comprising the steps of:

forming a photosensitive layer on a semiconductor substrate;

forming a latent image on said photosensitive layer by successively irradiating first and second stencil masks having an opening pattern with an energy beam, said opening pattern being generated by a method that includes, when given layout data is divided into complementary mask data, a layout data reading step; a boundary creating step of creating a boundary for dividing said layout data into a complementary mask; and a complementary layer generating step of dividing said layout data into fractionized patterns by said boundary and distributing fractionized patterns in such a manner that adjacent patterns via said boundary are in different layers;

developing said photosensitive layer; and processing said semiconductor substrate using said photosensitive layer having a pattern as a mask.

2. The method of manufacturing a semiconductor device according to claim 1, wherein said boundary creating step includes a graphics classifying step of extracting a rectangle having a predetermined range of width from said layout data.

3. The method of manufacturing a semiconductor device according to claim 1, wherein said boundary creating step includes a graphics classifying step of extracting a corner graphics from said layout data.

4. The method of manufacturing a semiconductor device according to claim 2, wherein based on a mesh line created from a reference point provided for each graphics classified in said graphics classifying step, a boundary is created in said graphics classified.

5. The method of manufacturing a semiconductor device according to claim 2, wherein a common area to a doughnut pattern and to a pattern of an input layout data is a boundary, the doughnut pattern being generated by deleting a graphics obtained by enlarging a corner graphics extracted in said graphics classifying step by a predetermined enlargement dimension not less than zero from a graphics obtained by enlarging the corner graphics by a larger dimension than said predetermined enlargement dimension.

6. The method of manufacturing a semiconductor device according to claim 5, wherein said enlargement dimension is (a minimum dimension value detectable in a mask test)/$\sqrt{2}$ or more.

7. The method of manufacturing a semiconductor device according to claim 1, wherein a position on which the boundary is created in said boundary creating step includes a position dividing a long side pattern not smaller than a predetermined dimension of said layout data.

8. The method of manufacturing a semiconductor device according to claim 7, wherein a dividing dimension of said long side pattern is changed depending on width of a pattern to be an opening.

9. The method of manufacturing a semiconductor device according to claim 7, wherein the dividing dimension of said long side pattern is changed depending on width of a portion other than the opening and adjacent to the pattern to be the opening, or an interval between said opening and a next opening.

10. The method of manufacturing a semiconductor device according to claim 1, wherein a position on which the boundary is created in said boundary creating step includes a position with a narrower interval between the patterns of said layout data than a predetermined dimension.

11. The method of manufacturing a semiconductor device according to claim 1, wherein a position on which the boundary is created in said boundary creating step includes two positions with a corner of said layout data interposed between the positions.

12. The method of manufacturing a semiconductor device according to claim 1, wherein in said complementary layer generating step, when an interval generated between the boundaries is not larger than a predetermined value, at least one of the boundaries is deleted or substituted for a new boundary created between said boundaries.

13. The method of manufacturing a semiconductor device according to claim 1, wherein said complementary layer generating step includes a minute pattern merging step of extracting and deleting a minute pattern not larger than a predetermined dimension in each complementary layer generated and adding said minute pattern not larger than the predetermined dimension to a different layer from the layer having included the minute pattern.

14. The method of manufacturing a semiconductor device according to claim 1, wherein a division prohibiting area is provided in said boundary creating step.

15. The method of manufacturing a semiconductor device according to claim 1, wherein the boundary created in said boundary creating step is a figure with an area, and a boundary graphics layer and a complementary layer are separately output in the complementary layer generation step.

16. The method of manufacturing a semiconductor device according to claim 15, wherein in the complementary layer generation step, a boundary figure is merged into at least one of the layers of the complementary mask.

17. The method of manufacturing a semiconductor device according to claim 1, further comprising a test step of testing whether said each complementary layer includes a doughnut pattern, whether OR of all the complementary masks match the input layout data, whether the complementary masks have an overlapping pattern therebetween, and whether a position against a rule of mask creation exists.

18. The method of manufacturing a semiconductor device according to claim 17, further comprising an error displaying step of displaying an error position from a test result, and an after-correction boundary reading step of reading a correction result of a boundary in the error position.

19. The method of manufacturing a semiconductor device according to claim 1, wherein in layout data for a complementary mask generated by a layout data dividing method for a complementary mask, a pattern area ratio within a range influenced by Coulomb effect around any chosen position of each complementary layer is not more than a predetermined value.

20. The method of manufacturing a semiconductor device according to claim 19, wherein the area ratio within the range influenced by the Coulomb effect is 30% and less.

21. A method of manufacturing a semiconductor device, comprising the steps of:

forming a photosensitive layer on a semiconductor substrate;

forming a latent image on said photosensitive layer by successively irradiating first and second stencil masks having an opening pattern with an energy beam, said opening pattern being generated by a method that includes, when given layout data is divided into complementary mask data, a layout data reading step; a processing parameter reading step; a step of extracting a corner graphics from said layout data; a step of determining said corner graphics as a first complementary layer data; a step of removing said first complementary layer data from said layout data to be a second complementary layer; and a test step of testing said complementary layer data;

developing said photosensitive layer; and processing said semiconductor substrate using said photosensitive layer having a pattern as a mask.

22. The method of manufacturing a semiconductor device according to claim 1, wherein said energy beam is an electron beam.

23. The method of manufacturing a semiconductor device according to claim 1, wherein patterns provided on said first and second stencil masks overlap to be a pattern of said given layout.

24. The method of manufacturing a semiconductor device according to claim 1, wherein in said complementary layer generation step, when a gate of an MOS transistor is formed by optical lithography, in order to generate a phase shift mask pattern for exposing both sides of said gate to light of substantially opposite phases, a graphic operation tool is used that has a function of outputting graphics on both sides of a graphics below a gate pattern as different graphics, and with the pattern to be divided by said boundary (the sum of the area of said fractionized patterns on both sides of said boundary and said boundary) and said boundary over the pattern, said fractionized patterns on both sides of said boundary are determined as a first complementary layer and a second complementary layer, respectively.

* * * * *